(12) United States Patent
Beidas et al.

(10) Patent No.: US 10,237,016 B2
(45) Date of Patent: Mar. 19, 2019

(54) SATELLITE TRANSMISSION INCLUDING NARROWBAND INTERFERENCE ERASURE

(71) Applicant: Hughes Network Systems, LLC, Germantown, MD (US)

(72) Inventors: Bassel F. Beidas, Alexandria, VA (US); Rohit Iyer Seshadri, Gaithersburg, MD (US); Lin-Nan Lee, Potomac, MD (US); Liping Chen, Bethesda, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 38 days.

(21) Appl. No.: 15/374,418

(22) Filed: Dec. 9, 2016

(65) Prior Publication Data

US 2018/0115390 A1     Apr. 26, 2018

Related U.S. Application Data

(60) Provisional application No. 62/410,587, filed on Oct. 20, 2016.

(51) Int. Cl.
*H04L 27/28* (2006.01)
*H04L 1/00* (2006.01)
*H03M 13/11* (2006.01)
*H04B 7/185* (2006.01)

(52) U.S. Cl.
CPC ....... *H04L 1/0041* (2013.01); *H03M 13/1105* (2013.01); *H04B 7/1858* (2013.01); *H04B 7/18519* (2013.01); *H04B 7/18582* (2013.01); *H04L 1/0045* (2013.01); *H04L 1/0058* (2013.01); *H04B 7/185* (2013.01)

(58) Field of Classification Search
CPC ............... H04L 27/2647; H04L 5/0007; H04L 27/2657; H04L 25/067; H04B 7/0845
USPC ........ 275/260, 267, 346, 347, 350; 370/208, 370/329
See application file for complete search history.

(56) References Cited

U.S. PATENT DOCUMENTS

| 5,325,188 A | 6/1994 | Scarpa |
| 9,203,431 B2 | 12/2015 | Lee et al. |
| 2002/0141356 A1 | 10/2002 | Beidas |
| 2004/0258184 A1* | 12/2004 | Liu .......................... H04B 1/68 375/350 |

(Continued)

OTHER PUBLICATIONS

M. Eroz and L. Lee, "Scrambled coded multiple access," Proceeding of Vehicle Technology Conference, Taipei, Taiwan, 2011.

(Continued)

*Primary Examiner* — Khai Tran
(74) *Attorney, Agent, or Firm* — Bejin Bieneman PLC

(57) ABSTRACT

A receiver, transmitter and system are programmed to communicate based on a signal including a plurality of signal components associated respectively with a plurality of subcarriers over a communications channel. The receiver is programmed to determine, from the plurality of subcarriers, a subcarrier subject to interference and erase the signal component associated with the subcarrier subject to interference. The receiver is further programmed to reconstruct the signal based on the plurality of first signal components excluding the erased first signal component.

41 Claims, 19 Drawing Sheets

(56) References Cited

U.S. PATENT DOCUMENTS

2012/0230445 A1* 9/2012 Kato .............. H04J 11/004
                                                  375/267
2015/0222322 A1  8/2015 Moffatt et al.
2016/0254937 A1  9/2016 Bayesteh

OTHER PUBLICATIONS

R. J. F. Fang, M. Eroz, and N. Becker, "Data collection and SCADA over GEO-MSS satellites using spread SCMA," Proc. of the International Workshop on Satellite and Space Communications, pp. 441-445, Sep. 2009.

L. Lee, M. Eroz, L. Chen, and R. Gopal, "Scrambled Code Multiple Access Waveform for Micro Satellite Terminals," Proc. Of Military Communications, MILCOM'12, Orlando, Florida, Oct. 2012.

Schmidl, T.M.; Cox, D.C., "Robust frequency and timing synchronization for OFDM," Communications, IEEE Transactions on, vol. 45, No. 12, pp. 1613-1621, Dec. 1997.

Van De Beek, J.J.; Sandell, M.; Borjesson, P.O., "ML estimation of time and frequency offset in OFDM systems," Signal Processing, IEEE Transactions on, vol. 45, No. 7, pp. 1800-1805, Jul. 1997.

Jun Mashino et al: "Subcarrier Suppressed Transmission Scheme for Satellite/Terrestrial Integrated Mobile Communication System", Vehicular Technology Conference Fall (VTC 2010-Fall), 2010 IEEE 72NDD, IEEE, Piscataway, NJ, USA, Sep. 6, 2010, pp. 1-5, XP031770399, ISBN: 978-1-4244-3573-9.

Lin-Nan Lee et al: "Scrambled Code Multiple Access Waveform for Micro Satellite Terminals", Military Communications Conference, 2012-MILCOM 2012, IEEE, Oct. 29, 2012, pp. 1-6, XP032315494, DOI: 10.1109/MILCOM.2012.6415683; ISBN: 978-1-4673-1729-0.

Invitation to Pay Additional Fees and, Where Applicable, Protest Fee for PCT/US2017/057290 dated Feb. 20, 2018 (13 pages).

U. Lambrette, M. Speth and H. Meyr, "OFDM burst frequency synchronization by single carrier training data," in IEEE Communications Letters, vol. 1, No. 2, pp. 46-48, Mar. 1997.

Non-Final Office Action dated Jun. 29, 2018 for U.S. Appl. No. 15/643,418 (40 pages).

* cited by examiner

SATELLITE TRANSMISSION INCLUDING NARROWBAND INTERFERENCE ERASURE

CROSS-REFERENCE TO RELATED APPLICATIONS

The subject patent application claims priority to and all the benefits of U.S. Provisional Patent Application No. 62/410,587 filed on Oct. 20, 2016, which is herein incorporated by reference in its entirety.

BACKGROUND

When satellite receivers are deployed in areas where terrestrial communication systems use the same radio frequency spectrum, satellite receivers may experience interference from the terrestrial signals. The performance of such interference-affected receivers can be severely degraded. The interfering signals can be from multiple sources; each occupying a small fraction of the bandwidth used by the satellite signal, but can be very strong at a specific receiver location. Instead of moving the satellite receiver to a location of negligible interference, or switching to a frequency without interference, an aspect of this disclosure describes a system and method and the corresponding apparatus that mitigate the interference with throughput reduction as a function of the bandwidth occupied by the terrestrial interference signal. In one example, each receiver operates autonomously without close coordination with the transmitter. The technique introduces minimal changes to the normal satellite transmitter and receiver. For satellite receivers at locations without interference, no noticeable performance degradation is observed.

SUMMARY

An exemplary system includes a receiver programmed to receive a first signal including a plurality of first signal components associated with a plurality of subcarriers over a communications channel. The receiver determines, from the plurality of subcarriers, a subcarrier subject to interference and erases the first signal associated with the subcarrier. The receiver reconstructs the first signal based on the plurality of first signal components excluding the erased first signal component.

In another example, the first signal is forward error correction encoded. According to this example, reconstructing the first signal includes forward error correction decoding.

In another example, the forward error correction encoding includes a k/n low-density parity-check code with n=9 and k=1, 2, 3, 4, 5, or 6.

In another example, the receiver is programmed to determine a log-likelihood ratio for each first signal component. According to this example, erasing the first signal component associated with the subcarrier subject to interference includes setting the log-likelihood ratio to zero for the first signal component associated with the subcarrier associated with the interference.

In another example, the log-likelihood ratio for each component is generated based at least in part on amplitude phase-shift keying (APSK) modulation.

In another example, the receiver is programmed to filter the first signal prior to determining, from the plurality of subcarriers, the subcarrier subject to interference.

In another example, the filtering is based at least in part on decimating filter coefficients.

In another example, the receiver is programmed to receive data indicating the frequency of a source of interference, and to determine the subcarrier subject to interference based on the data.

In another example, the receiver is programmed to determine that the subcarrier is subject to interference based on a power level of the subcarrier being greater than a threshold.

In another example, the receiver is programmed to measure a power level of each of the plurality of subcarriers, and determine that the subcarrier is subject to interference based on a power level of the subcarrier relative to other subcarriers.

In another example, the subcarriers are orthogonal.

In another example, the plurality of subcarriers includes N subcarriers. According to this example, the processor is further programmed to perform an N point fast Fourier transform on the received first signal prior to determining the subcarrier subject to interference.

In another example, the first signal includes a unique word and the processor is further programmed to synchronize the fast Fourier transform based on the unique word.

According to another example, the communications channel from which the receiver receives the first signal includes a satellite.

In another example, the first signal includes a pilot symbol and the processor is further programmed to synchronize reception of the first signal based at least in part on the pilot symbol.

In another example, the first signal includes scrambling, and the processor is further programmed to descramble the first signal prior to determining from the plurality of subcarriers a subcarrier subject to interference.

In another example, the first signal includes frequency spreading, and the processor is further programmed to despread the first signal prior to determining from the plurality of subcarriers a subcarrier subject interference.

In another example, a power level of the first signal is below a power level of a noise floor.

In another example, an exemplary system includes a transmitter. The transmitter is programmed to receive a first source signal, and generate a plurality of first source signal components based on the received first source signal. The transmitter is further programmed to associate each of the first source signal components with a respective subcarrier and generate a second source signal including each of the first signal components together with the respective subcarriers. The transmitter is further programmed to generate a third source signal by applying a transmit filter operation to the second source signal and transmit the third source signal to a second computing device.

According to one example, the subcarriers transmitted by the transmitter are orthogonal.

In another example, generating the second source signal includes inserting one or more pilot symbols into the second source signal.

In another example, generating the plurality of first signal components by the transmitter includes encoding the first source signal components for forward error correction.

In another example, the forward error correction includes a k/n low-density parity-check code with n=9 and k=1, 2, 3, 4, 5, or 6.

In another example, the transmitter transmits the third source signal via a communications channel including a satellite.

In another example, the transmit filter operation performed by the transmitter includes an interpolation filter operation.

In another example, the transmitter performs an inverse fast Fourier transform in order to associate each of the first source signal components with respective subcarriers.

In another example, prior to associating the plurality of first source signal components respectively with the plurality of subcarriers, the first processor is programmed to scramble respectively the plurality of first source signal components.

In another example, prior to associating the plurality of first source signal components respectively with the plurality of subcarriers, the first processor is programmed to spread the frequency respectively of the plurality of first source signal components.

In another example, the first processor is programmed to insert a unique word into the second source signal.

In another example, the exemplary system including the transmitter further includes a receiver. The receiver is programmed to receive the third source signal transmitted by the transmitter. The third source signal includes the plurality of first signal components associated respectively with the plurality of subcarriers. The receiver is further programmed to determine, from the plurality of subcarriers, a subcarrier subject to interference. The receiver is further programmed to erase a first signal component associated with the subcarrier determined to be subject to interference. The receiver is further programmed to reconstruct the first signal based on the plurality of first signal components excluding the erased first signal component.

In another example, reconstructing third source signal includes forward error correction decoding.

In another example, the receiver is programmed to filter the third source signal prior to determining, from the plurality of subcarriers, the subcarrier subject to interference.

An exemplary method includes receiving, by a receiver, a first signal including a plurality of first signal components associated respectively with a plurality of subcarriers over a communications channel. The method further includes determining, from the plurality of subcarriers, a subcarrier subject to interference, and erasing the first signal component associated with the subcarrier determined to be subject to interference. The method further includes reconstructing the first signal based on the plurality of first signal components excluding the erased first signal component.

In another example, the first signal is forward error correction encoded, and reconstructing the first signal includes forward error correction decoding.

In another example, the method includes determining a log-likelihood ratio for each signal component. According to this example, erasing of the first signal component associated with the subcarrier subject to interference includes setting the log-likelihood ratio to zero for the first signal component associated with the subcarrier subject to interference.

According to another example, the method further includes filtering the first signal prior to determining, from the plurality of subcarriers, the subcarrier subject to interference.

In another example, the method further includes receiving data indicating a frequency of a source of interference, and determining the subcarrier subject to interference based on the data.

In another example, the method further includes determining that the subcarrier is subject to interference based on a power level of the subcarrier.

In another example, the plurality of subcarriers includes N subcarriers, and the method further includes performing an N point fast Fourier transform on the received signal prior to determining the subcarrier subject to interference.

In another example, the first signal includes a unique word, and the method includes synchronizing the fast Fourier transform based at least in part on the unique word.

In another example, the first signal includes a pilot symbol, and the method includes synchronizing reception of the first signal based at least in part on the pilot symbol.

In another example, the first signal includes scrambling, and the method includes descrambling the first signal prior to determining, from the plurality of subcarriers, the subcarrier subject to interference.

In another example, the first includes frequency spreading, and the method includes despreading the first signal prior to determining, from the plurality of subcarriers, the subcarrier subject to interference.

DRAWINGS

DETAILED DESCRIPTION

Introduction

Figure 1:
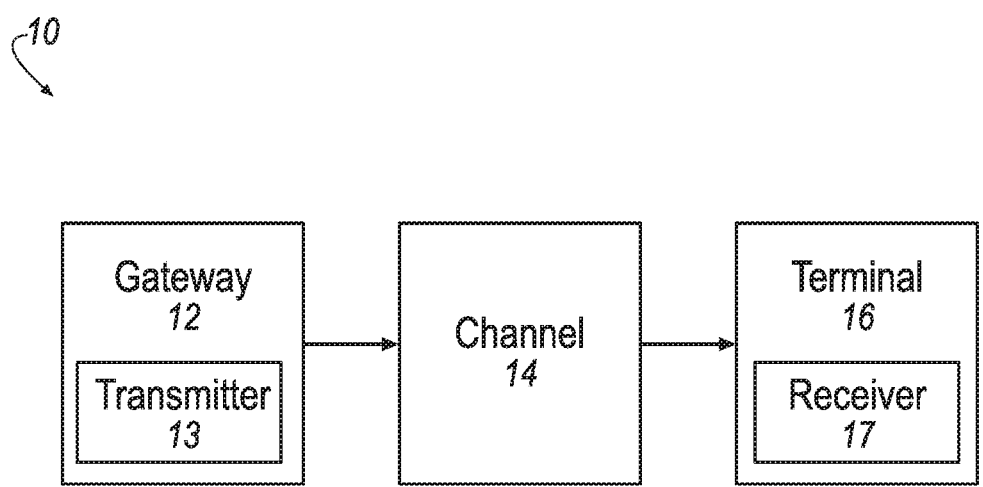
FIG. 1 is a block diagram of an exemplary system for satellite transmissions including frequency division multiplexing and narrowband interference erasure.

In a first example, as shown in FIG. 1, a system 10 to improve robustness against single or multiple sources of narrowband interference employs Orthogonal Frequency Division Multiplexing (OFDM)-like signaling. To mitigate interference, a receiver 17, e.g., in a terminal 16, uses erasure of the signal components produced by interference-corrupted frequency-domain subcarriers. A signal component typically includes one or more symbols, each symbol representing a number of data bits of the first signal.

A transmitter 13, e.g., in a gateway 12, utilizes interpolation filtering to ensure suppression of out-of-band emissions to acceptable levels. The receiver 17 in the terminal 16 utilizes decimation filtering to provide enhanced performance. The decimation filtering is applied while keeping the additional processing transparent to sites that are not affected by interference. In addition, the exemplary system 10 can also successfully interwork with Adaptive Coding and Modulation (ACM) where a lower modulation and code (MODCOD) rate pair can be used by the affected sites to provide optimal performance given the affected sites' local conditions.

In a second example, OFDM-like signaling can be applied to Scrambled Code Multiple Access (SCMA)-based communications, resulting in improved anti-jamming resistance.

System Elements

The gateway 12 is a computing device including a memory and a processor, the processor programmed to execute programs stored by the memory. The gateway 12 includes a transmitter 13 for transmitting, via a channel 14, signals to a terminal 16.

The transmitter 13 may include one or more processors and memories, the memories storing software programming executable by the processor(s). Additionally or alternatively, the transmitter 13 can include hardware and/or firmware. The transmitter 13 is programmed to utilize OFDM-like signaling, wherein a signal is transmitted via a plurality of orthogonal subcarriers, each corresponding to a rectangular pulse shape in time, spaced in the frequency domain with separation that is equal to the symbol area.

An exemplary process 130 for transmitting signals, including OFDM-like signaling, is described below.

The channel 14 represents one or more mechanisms for providing radio frequency communications between two or more computing devices such as the gateway 12 and the terminal 16. The channel 14 can include, for example, a satellite including one or more repeaters. The repeaters receive signals from, e.g., the gateway 12, increase a power level of the received signal, and retransmit the signals to one or more terminals 16. The channel 14 may perform other operations such as filtering, frequency translation, etc.

Due, for example, to noise, and non-linear interference effects, signals may be attenuated, or otherwise altered, by the communications channel 14. The system 10 may utilize coding to combat noise and other issues associated with the channel 14, such as forward error correction (FEC) codes.

Note that, although the system 10 is described herein in reference to satellite communications, the presently disclosed teachings could apply to other radio frequency communications subject to narrowband interference.

The terminal 16 is a computing device and is programmed to receive communications from the gateway 12 via a channel 14.

The terminal 16 includes a receiver 17 for receiving signals from the gateway 12 transmitter 13. The terminal 16 receiver 17 may include one or more processors and memories, the memories storing software programming executable by the processor(s). Additionally or alternatively, the receiver 17 can include hardware and/or firmware. The receiver 17 is programmed to receive the OFDM-like signaling and reconstruct the signal. The receiver 17 is further programmed, as described in detail below, to erase signal components associated with subcarriers subject to narrowband interference.

An exemplary process 170, for receiving signals including OFDM-like signaling, including erasure of signals associated with subcarriers subject to narrowband interference, is described below.

The description that follows will describe a transmitter 13 in a gateway 12 transmitting signals to a receiver 17 in a terminal 16 via the channel 14. Other transmitter/receiver pairs, such as a transmitter in the terminal 16 transmitting signals via the channel 14 to a receiver in the gateway 12, may also be programmed to utilize OFDM-like signaling.

Figure 2:
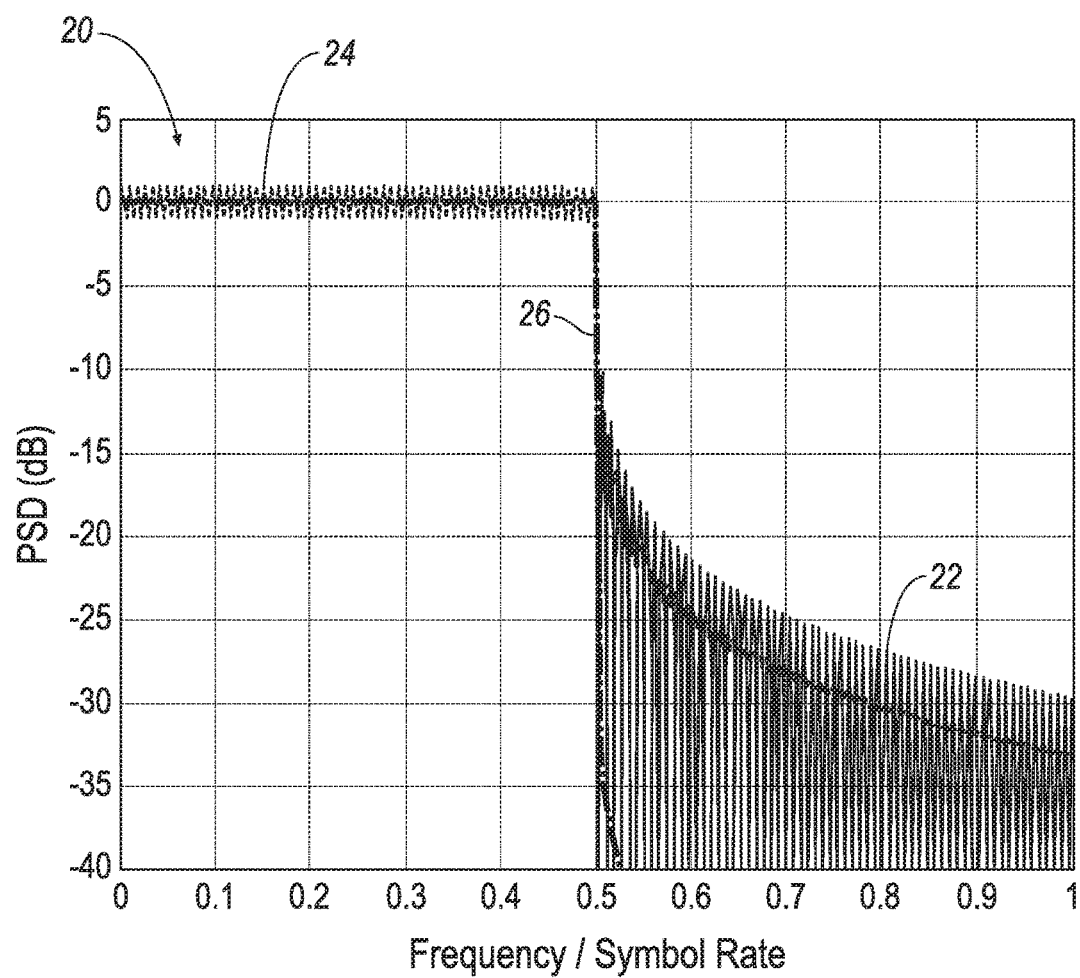
FIG. 2 is an exemplary graph of power spectral density for satellite transmissions based on alternate transmission schemes.

FIG. 2 is an exemplary graph of two known transmission schemes (plots 22 and 24) as they may apply to the system 10 and an exemplary plot of power spectral density for a transmission scheme according to the presently disclosed teachings (plot 26) for the system 10.

The exemplary plot 22 shows a power spectral density of a transmission according to conventional Orthogonal Frequency Division Multiplexing (OFDM). Conventional OFDM uses rectangular pulse shaping to guarantee orthogonality between subcarriers. This causes conventional OFDM to exhibit a low-decaying sin(x)/x behavior in the frequency domain as is shown.

For a satellite uplink spectrum, the FCC sets strict limits on out-of-band (OOB) emissions, which can be violated by conventional OFDM. The gateway 12 transmitter implements a polyphase transmit filter to efficiently upsample and to reduce OOB emission levels and bring them within levels desired for satellite transmissions.

The exemplary plot 24 shows a power spectral density of a transmission according to conventional OFDM including cyclic prefix. This transmission requires additional signal energy to transmit, and creates strong ripples in the in-band-region of the conventional OFDM spectrum. The gateway 12 transmitter 13 advantageously does not require cyclic prefix, and thus overcomes these problems.

The exemplary plot 26 shows a power spectral density of a transmission according to OFDM-like signaling including a polyphase filter structure. The filter coefficients follow a root-raised cosine (RRC) shape with low rolloff values. Generation of the root-raised cosine coefficients is described in Equation 8 with regard to block 42 in process 170 and is also referenced with regard to block 36 of process 130.

Figure 3:
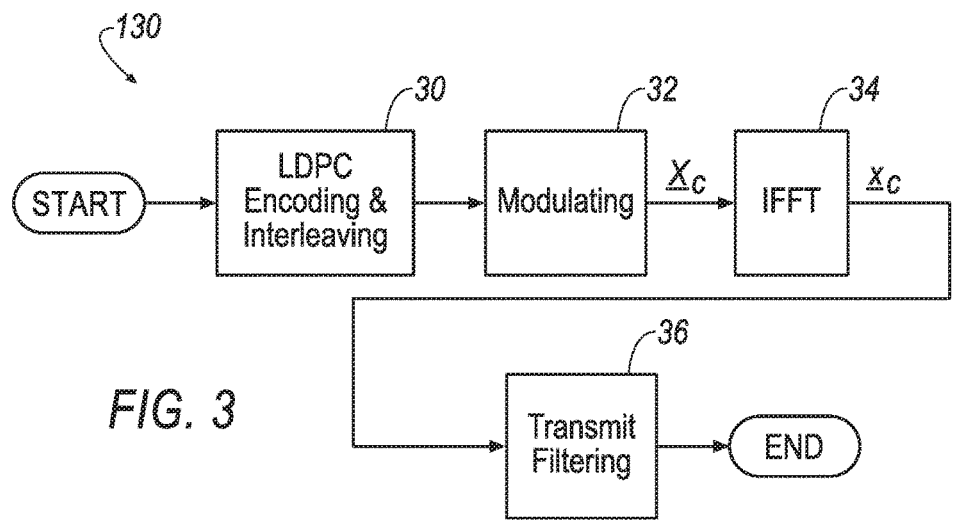
FIG. 3 is a diagram of an exemplary process for transmitting data via satellite including frequency division multiplexing.

FIG. 3 is a process flow diagram of an exemplary process 130 for transmitting data via a satellite including frequency division multiplexing. The process 130 starts in a block 30.

In the block 30, the transmitter 13 is programmed to receive a first source signal for transmission via the channel 14 to the terminal 16 receiver 17. The transmitter 13 is programmed to generate an encoded vector signal from the first source signal. The transmitter 13 may be programmed to perform error correction encoding that adds information to reduce information loss at the receiver 17. Additionally or alternatively, the transmitter 13 may be programmed to interleave data from the first source signal in the encoded vector signal.

Upon generating the encoded vector signal, the process 130 continues in a block 32.

In the block 32, the transmitter 13 is programmed to generate a vector of symbols $\underline{X}_C=[X_0, X_1, \ldots, X_{N_C-1}]^T$, forming a codeblock of $N_C \times 1$, based on the encoded vector signal.

Each component of this vector is drawn from a complex-valued digital constellation. Two examples of constellations are amplitude phase-shift keying (APSK) and quadrature amplitude modulation (QAM).

The transmitter 13 segments the vector of coded symbols $\underline{X}_C$ into $N_{OFDM}$ blocks, each with N symbols to modulate orthogonal subcarriers in the frequency domain, where $$N_{OFDM} = \frac{N_C}{N}. \quad (1)$$

Padding of a small number of extra symbols might be needed to make $N_{OFDM}$ in (1) a whole integer. The padding symbols may be distributed into different blocks or introduced as one segment.

The vector $\underline{X}_C$ can be formed by stacking vectors relating to blocks as $$\underline{X}_C = \begin{bmatrix} \underline{\tilde{X}}_0 \\ \underline{\tilde{X}}_1 \\ \vdots \\ \underline{\tilde{X}}_{N_{OFDM}-1} \end{bmatrix}, \quad (2)$$

where $$\underline{\tilde{X}}_l = \begin{bmatrix} X_{l \cdot N} \\ X_{l \cdot N+1} \\ \vdots \\ X_{(l+1) \cdot N-1} \end{bmatrix} \quad (3)$$

is of size $N \times 1$ and $l=0, 1, \ldots, N_{OFDM}-1$.

Upon generating the vectors $\underline{X}_C$ and $\underline{\tilde{X}}_l$, the process 130 continues in a block 34.

In the block 34, the transmitter 13 is programmed to process each vector $\underline{\tilde{X}}_l$ by an N-point inverse fast Fourier transform (IFFT) to generate l-th OFDM symbol as follows:

$$x_{l,n} = \frac{1}{\sqrt{N}} \cdot \sum_{k=0}^{N-1} \tilde{X}_{l,k} \cdot e^{(j2\pi kn/N)}, \quad (4)$$

where $\tilde{X}_{l,k}$ is the k-th component of vector $\underline{\tilde{X}}_l$ in (3) and $n=0, 1, \ldots, N-1$. The samples $x_{l,n}$ in (4) are stacked to form the codeblock in the time domain as $$\underline{x}_C = \begin{bmatrix} \underline{x}_0 \\ \underline{x}_1 \\ \vdots \\ \underline{x}_{N_{OFDM}-1} \end{bmatrix} \quad (5)$$

of size $N \times 1$, where $$\underline{x}_l = \begin{bmatrix} x_{l,0} \\ x_{l,1} \\ \vdots \\ x_{l,N-1} \end{bmatrix}. \quad (6)$$

Alternatively, the OFDM block $\underline{x}_l$ can be generated by a matrix-vector multiplication as $$\underline{x}_l = F^H \cdot \underline{\tilde{X}}_l, \quad (7)$$

where F is an $N \times N$ discrete Fourier transform (DFT) matrix.

Upon generation of the time-domain codeblock $\underline{x}_C$, the process 130 continues in a block 36.

In the block 36, the transmitter 13 is programmed to apply a filter such as an interpolation filter to the time-domain codeblock $\underline{x}_C$ to achieve oversampling, to $N_{ss}$ samples per OFDM symbol, and to provide filtering to limit the out-of-band (OOB) emissions to desired levels. This can be done using a polyphase filter structure. Examples of filter coefficients follow root-raised cosine (RRC) shape with low rolloff values. Determination of the filter coefficients is discussed in additional detail below with regard to the block 42 of process 170.

Upon application of the interpolation filter to the time domain codeblock $\underline{x}_C$, the gateway 12 transmitter 13 is programmed to transmit the transmit filter output signal, via the channel 14, to the terminal 16 receiver 17.

Note that shortening or puncturing can be used instead of padding discussed above. Also, unlike conventional OFDM, the transmitter 13 does not use cyclic prefix. Using cyclic prefix requires additional signal energy to transmit and creates ripples in the in-band region of the conventional OFDM spectrum. In addition, the transmit filtering can provide adequate suppression of 00B emissions to the strict limits set by the Federal Communications Commission (FCC) on the satellite uplink transmission.

Figure 4:
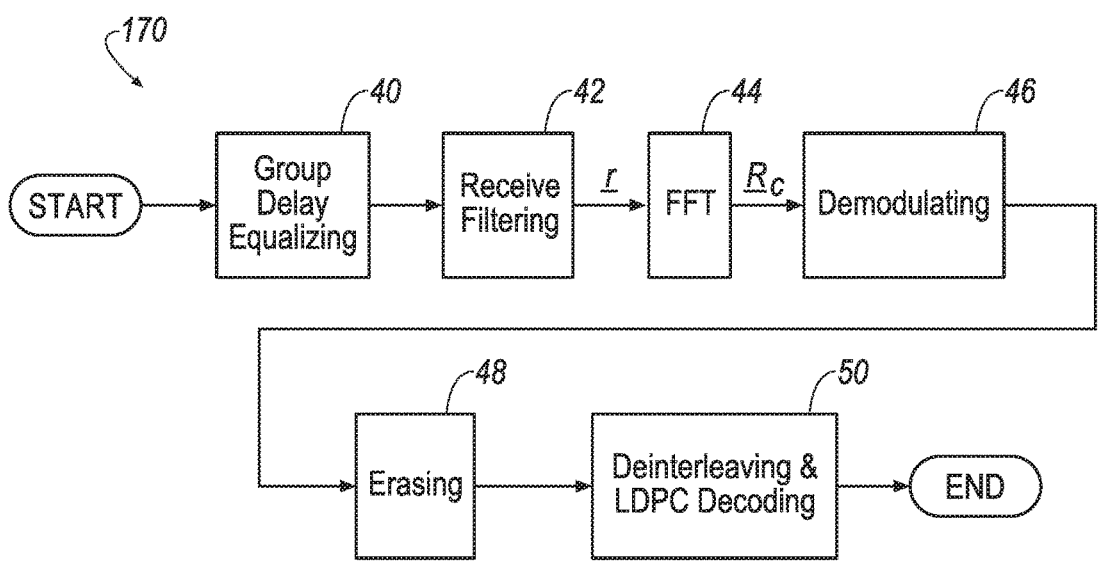
FIG. 4 is a diagram of an exemplary process for receiving data via satellite including erasure of signal components associated with subcarriers subject to interference.

FIG. 4 is a diagram of an exemplary process 170 for receiving data via satellite including erasure of signal components associated with subcarriers subject to interference. The exemplary process 170 starts in a block 40.

In the block 40, the receiver 17 is programmed to perform group delay equalization on a first received signal including data and multiple subcarriers, with the data distributed over the subcarriers, thereby generating an equalized signal with the group delay reduced or removed. The receiver 17 operates at multiple samples per symbol to remove any group delay introduced into the first received signal by the multiplexing filters used in the satellite transponder. Upon generating the equalized signal, the process 170 continues in a block 42.

In the block 42, the receiver 17 is programmed to perform filtering operation on the equalized signal. For example, the receiver 17 may perform decimation filtering to provide the equalized signal at the best sampling instant, at one sample per symbol, and to filter the noise from the non-signal band. This filtering can be done using a polyphase filter structure. For good performance, the decimating filter coefficients form a matched pair with the ones used at the gateway 12 transmitter 13. For example, the filter coefficients can follow a root-raised cosine (RRC) shape with low rolloff values, as described below.

$$p(t) = \frac{2\alpha}{\pi\sqrt{T_s}} \cdot \frac{\cos[(1+\alpha)\pi t/T_s] + \frac{\sin[(1-\alpha)\pi t/T_s]}{4\alpha t/T_s}}{[1 - (4\alpha t/T_s)^2]}, \quad (8)$$

Let $r=[r[0], r[1], \ldots, r[N_{OFDM} \cdot N-1]]^T$ be the vector of received symbols at the output of the decimating filter. The vector of received symbols r is then segmented into $N_{OFDM}$ blocks, each with N samples.

The vector $\underline{r}$ can be formed by stacking vectors relating to blocks as $$\underline{r} = \begin{bmatrix} \tilde{r}_0 \\ \tilde{r}_1 \\ \vdots \\ \tilde{r}_{N_{OFDM}-1} \end{bmatrix}, \quad (9)$$

where $$\tilde{r}_l = \begin{bmatrix} r[l \cdot N] \\ r[l \cdot N + 1] \\ \vdots \\ r[(l+1) \cdot N - 1] \end{bmatrix} \quad (10)$$

is of size N×1 and $l=0, 1, \ldots, N_{OFDM}-1$.

Upon generating the vector $\tilde{r}_l$, the process 170 continues in a block 44.

In the block 44, the receiver 17 is programmed to process each vector $\tilde{r}_l$ by an N-point fast Fourier transform (FFT) to generate $$R_{l,k} = \sum_{n=0}^{N-1} \tilde{r}_{l,n} \cdot e^{(-j2\pi kn/N)}, \quad (11)$$

where $\tilde{r}_{l,n}$ is the n-th component of vector $\tilde{r}_l$ in (10) and $k=0, 1, \ldots, N-1$. The samples $R_{l,k}$ in (10) are stacked to form the codeblock of received symbols in the frequency domain as $$\underline{R}_C = \begin{bmatrix} \underline{R}_0 \\ \underline{R}_1 \\ \vdots \\ \underline{R}_{N_{OFDM}-1} \end{bmatrix} \quad (12)$$

of size N×1, where $$\underline{R}_l = \begin{bmatrix} R_{l,0} \\ R_{l,1} \\ \vdots \\ R_{l,N-1} \end{bmatrix}. \quad (13)$$

Alternatively, the received block $\underline{R}_l$ can be generated by a matrix-vector multiplication as $$\underline{R}_l = F \cdot \tilde{r}_l \quad (14)$$

where F is an N×N DFT matrix.

Upon generating the received codeblock of symbols $\underline{R}_C$, the process 170 continues in a block 46.

In the block 46, the receiver 17 is programmed to demodulate the codeblock of symbols $\underline{R}_C$. The demodulation may include, for example, APSK demodulation or QAM demodulation. Based on the codeblock of symbols $\underline{R}_C$, the receiver 17 generates log-likelihood ratio (LLR) values of the received bits.

The LLR values are calculated using a known technique such as the technique described in U.S. Pat. No. 9,203,680 that takes into account the clustering and warping experienced by the samples following the FFT process, due to non-linear distortion. Upon generating the LLR values, the process 170 continues in a block 48.

In the block 48, the receiver 17 is programmed to erase bits corresponding to the subcarriers that are corrupted by interference. One way to achieve erasure is to replace the LLR values associated with the interference-corrupted bits with zeroes in decibels.

In some cases, the interfered frequency is known. For example, a known terrestrial site proximate to a terminal 16 may be transmitting in a known range of frequencies in the Ka-band. Proximate to the terminal 16 may be defined as within a distance such that a signal transmitted from the terrestrial site interferes with communications between the gateway 12 and the terminal 16.

In other cases, the interference frequency may be unknown. For example, a mobile source such as an interfering transmitter on a mobile platform, such as cars, trailers, RVs, boats, etc. can interfere with a transmission. The power level of the interference signal is generally substantially higher at the interference frequency than the signal of interest from the transmitter 13. The frequency of the interference signal may be determined by identifying power level peaks across the frequency range of interest.

For example, the terminal 16 receiver 17 may be programmed to measure a power level of each subcarrier, and identify one or more subcarriers that have a power level above a predetermined threshold. The predetermined threshold may be a fixed value such as 2 dB. Alternatively, the threshold may be raised and lowered to maintain a constant probability of false alarm.

Upon erasing the bits corresponding to the subcarriers that are corrupted by interference, the process 170 continues in a block 50.

In the block 50, the receiver 17 is programmed to deinterleave the received bits and decodes the deinterleaved bits to retrieve estimates of the transmitted information bits.

Upon retrieving estimates of the transmitted information bits, the process 170 ends.

The transmission scheme according to the presently disclosed teachings can interwork with ACM, as a lower MODCOD can be used for the interfered sites to provide best performance given its local condition. For example, a table can be used to translate the number of subcarriers erased to corresponding $E_s/N_0$ reduction as the adjustment needed to the measured $E_s/N_0$ on the received signal. The gateway 12 can use the adjusted value to determine the MODCOD for transmission to the particular terminal 16.

Note that for sites with no interference, the additional processing, including the use of OFDM-like signaling, identification, erasure of signal components associated with subcarriers subject to interference, etc., is transparent.

Figure 5:
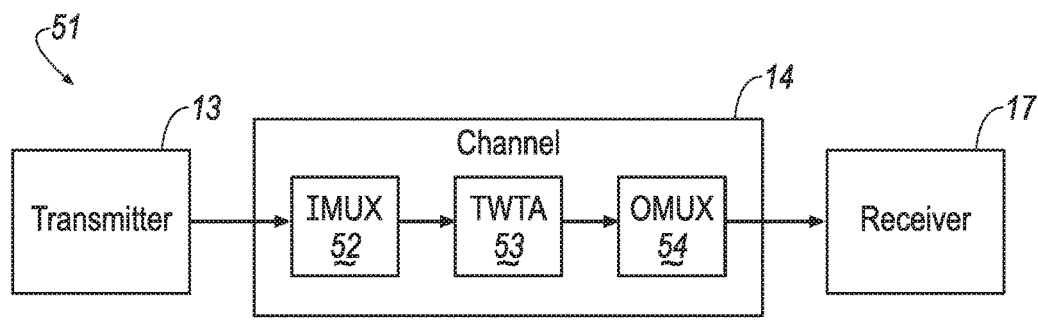
FIG. 5 is a block diagram of an exemplary satellite transmission system for simulating frequency division multiplexing with narrowband interference erasure.

FIG. 5 illustrates a simulation model 51 of an OFDM-like transmission system according to the presently disclosed teachings including the exemplary transmitter 13, the exemplary channel 14 and the exemplary receiver 17 from the system 10. The operation of the exemplary transmitter 13 and the operation of the exemplary receiver 17 are described in detail above.

The exemplary channel 14 includes an input multiplexing (IMUX) filter 52, a traveling wave tube amplifier (TWTA) 53 and an output multiplexing (OMUX) filter 54 whose characteristics are typical of a Ka-band satellite transponder as are known. For forward error correction (FEC), low-density parity-check (LDPC) codes from the digital video broadcasting second generation (DVB-S2) and DVB-S2 Part II Extensions (S2X) standards for forward error correction can be used.

The complex symbols received as input for the IFFT processing performed by the transmitter 13 in block 34 (FIG. 3) are drawn from a 4+12 amplitude phase shift keying (APSK) constellation. N=128 point IFFT/FFT pairs are applied at the transmitter 13 and receiver 17, respectively. A pair of root-raised cosine (RRC) filters with rolloff factor of 0.05 serve as the interpolation filter (included in the transmitter 13) and decimation filter (included in the receiver 17). A symbol rate of 235 Msps is considered. No cyclic prefix is transmitted.

Figure 6:
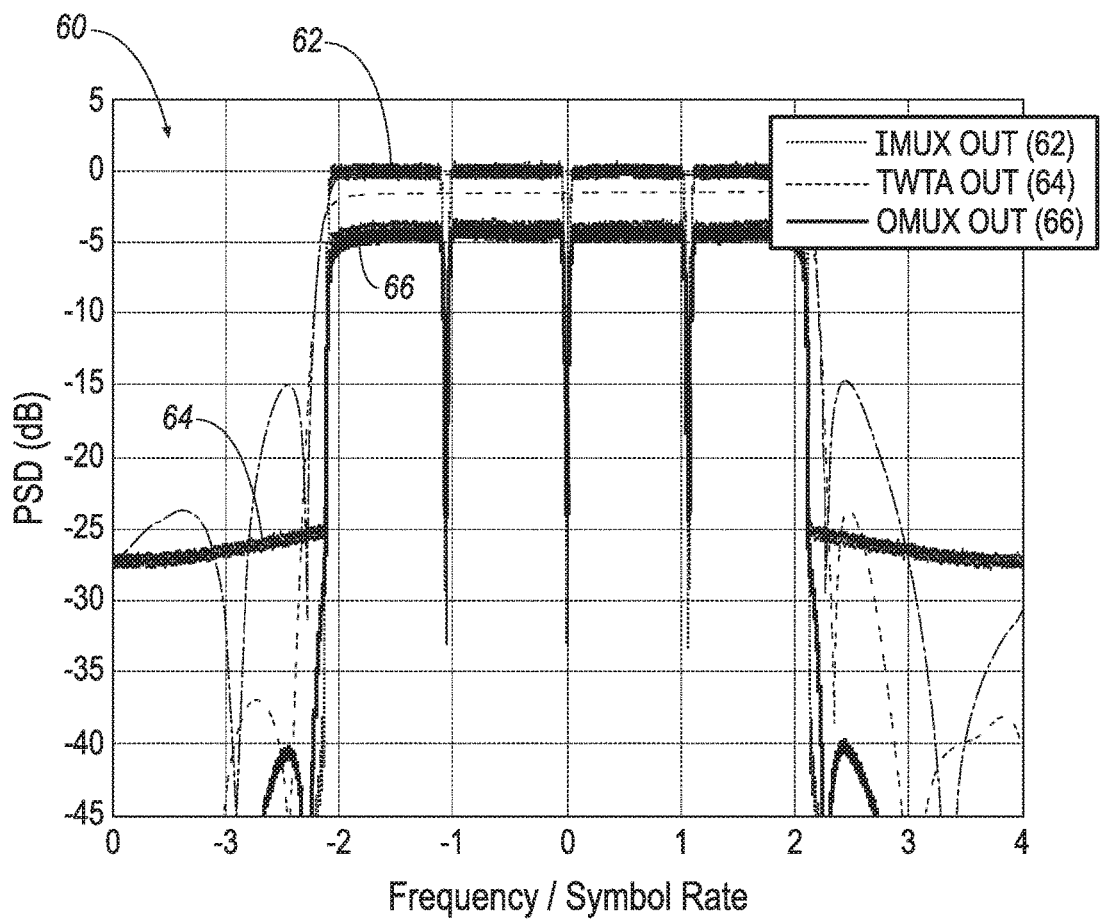
FIG. 6 is a graph of an exemplary simulation of a satellite transmission channel transmitting signals based on frequency division multiplexing.

FIG. 6 shows the power spectral density (PSD) for a four carriers-per-TWTA scenario at the output 62 of the IMUX filter 52, the output 64 of the TWTA 53 and the output 66 of the OMUX 54 for the proposed OFDM-like transmission system 51. The output back-off (OBO) measured at the TWTA output is 4 dB. The use of interpolation filters ensures that the out-of-band (OOB) emissions are at levels comparable to current single-carrier transmissions that do not employ N-point IFFT processing (block 34) in the transmitter 13.

Figure 7A:
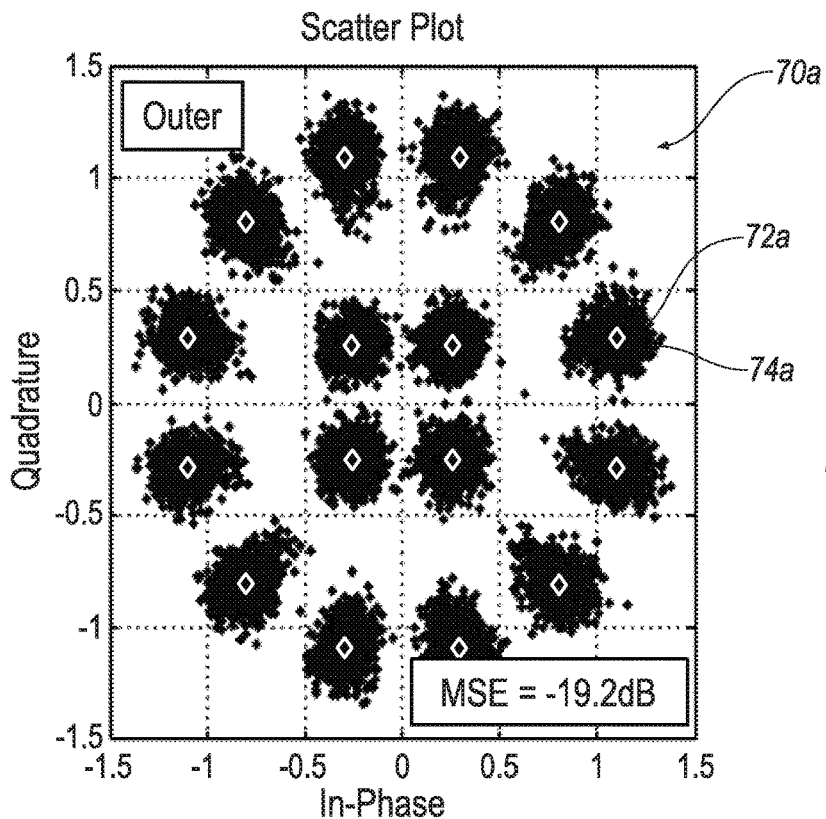
FIG. 7A is a scatter plot diagram of an exemplary simulation of received signals based on frequency division multiplexing and APSK modulation.
Figure 7B:
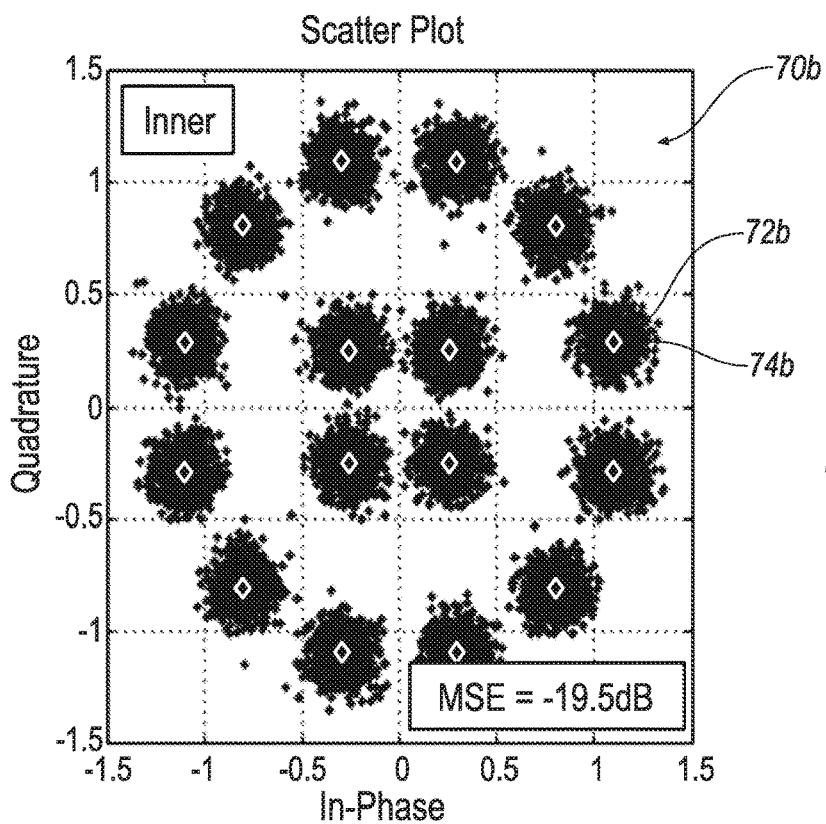
FIG. 7B is a scatter plot diagram of an exemplary simulation of received signals based on frequency division multiplexing and APSK modulation.

FIGS. 7A and 7B shows the noiseless scatterplots 70a, 70b of the samples at the output of the 128-point receiver FFT processing (block 44) respectively for an outer carrier and an inner carrier, from the four carriers-per-TWTA scenario shown in FIG. 6 at OBO=4 dB. The underlying 4+12APSK constellation points (marked in black-diamonds with white outlines) 74a, 74b which was transmitted on the carriers has been distorted by nonlinear inter-symbol interference (ISI) and adjacent carrier interference (ACI), resulting in the signal clusters 72a, 72b around the constellation points 74a, 74b. The distortion is quantified in terms of the mean square error (MSE) between the received samples and the underlying constellations. Simulations indicate an MSE of −19.2 dB for the outer carrier (FIG. 7A) and an MSE of −19.5 dB for the inner carrier (FIG. 7B). It is expected that such MSE level allows successful operation as shown later.

Figure 8:
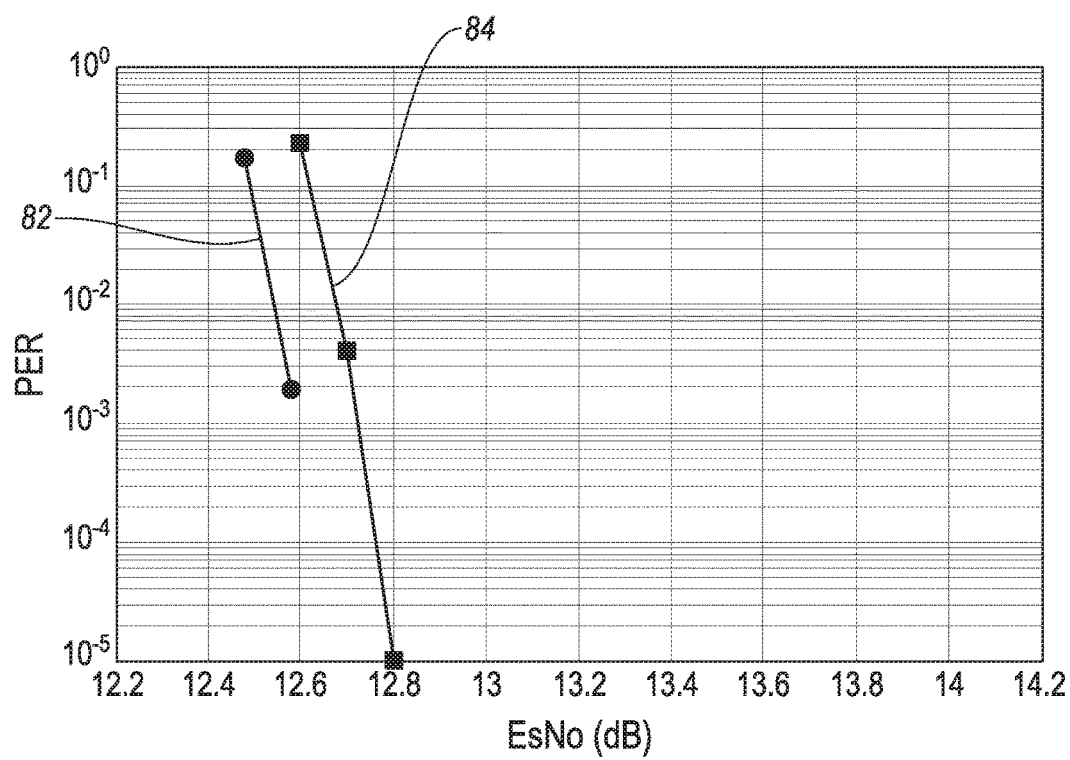
FIG. 8 is graph of an exemplary simulation of the packet error rate (PER) performance as a function of energy per symbol to noise spectral density ($E_s/N_0$) for an inner carrier, as part of a four carriers-per-TWTA configuration.

FIG. 8 reports the packet error rate (PER) performance as a function of energy per symbol to noise spectral density ($E_s/N_0$) for an inner carrier, as part of the four carriers-per-TWTA configuration. The signal-to-noise ratio (SNR) parameter $E_s/N_0$ accounts for the backoff that the TWTA requires and any losses incurred from distortions resulting from the nonlinearity, filters and channel. A rate 28/45 LDPC code from the DVB-S2X standard is used for forward error correction (FEC). The figure compares the performance of our proposed OFDM-like transmission technique (plot 84) with a conventional system (plot 82) that does not employ an IFFT processing (block 34)/FFT processing (block 44) pair at the transmitter 13/receiver 17, respectively. Simulations indicate only a 0.15 dB loss in performance of the OFDM-like system (plot 84) relative to a conventional single-carrier system (plot 82), even in the presence of nonlinear amplification in the satellite transponder.

Figure 9:
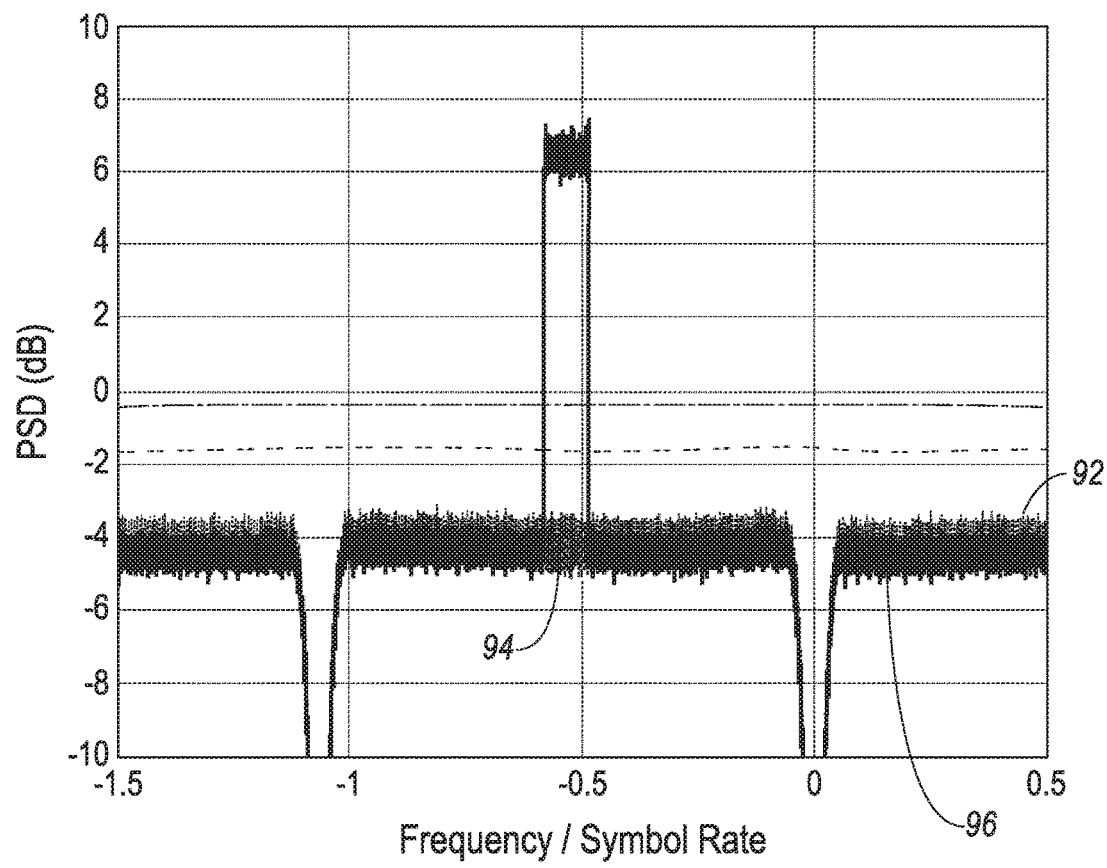
FIG. 9 is a graph of an exemplary simulation of a satellite transmission channel transmitting signals based on frequency division multiplexing and illustrating narrowband interference.

FIG. 9 illustrates a signal plot 92, representing the output from the TWTA 53 of the channel 14. FIG. 9 further illustrates a signal-without-interference plot 94 representing the output from the OMUX 54, and a signal-with-interference plot 96 representing the output from the OMUX 54.

Single-carrier transmissions suffer from substantial degradations in the presence of strong narrow band interference, such as the interference shown in the signal-with-interference plot 96 of FIG. 9. Since the interfering carrier is usually stronger than a desired carrier (e.g., a carrier of an intended communication between the transmitter 13 and the receiver 17), the interference from the interfering carrier causes a substantial performance loss in single-carrier systems in which the information symbols are spread across the entire bandwidth.

In contrast, the OFDM-like transmission transmits the information symbols across several narrow subcarriers. As a consequence, only a small percentage of subcarriers will be affected by the narrow band interference, making it possible to recover the information using the unaffected sub-bands and error correction coding.

Figure 10A:
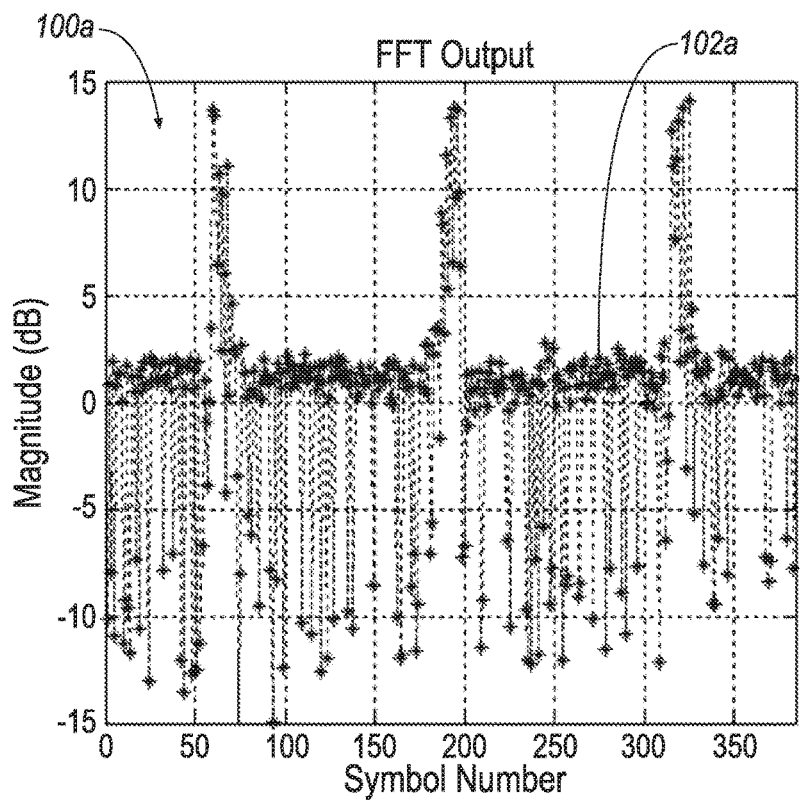
FIG. 10A is a graph of an exemplary simulation showing the FFT output of received samples occurring at frequency bins corresponding to the subcarriers impacted by a narrowband interferer.
Figure 10B:
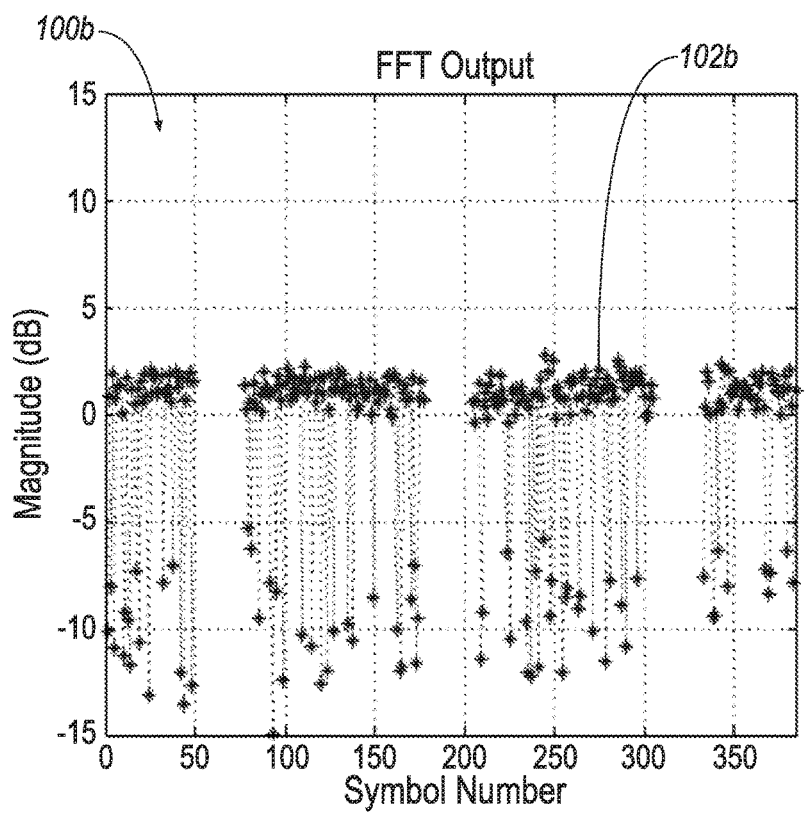
FIG. 10B is a graph of the exemplary simulation of FIG. 10A with erasure of the signal components associated with subcarriers impacted by the narrowband interferer.

Such information recovery is illustrated in FIGS. 10A and 10B, which show the samples at the output for three consecutive 128-point FFT blocks in the inner-carrier's receiver that was affected by the narrow band interferer shown in FIG. 9. The interference manifests itself as noticeable spikes (FIG. 10A) in the received samples occurring at frequency bins corresponding to the subcarriers impacted by the narrowband interferer. It is hence possible to erase the symbols which belong to the impacted subcarriers and assign a value of 0 dB to the LLRs of the bits corresponding to those symbols (FIG. 10B)

Figure 11:
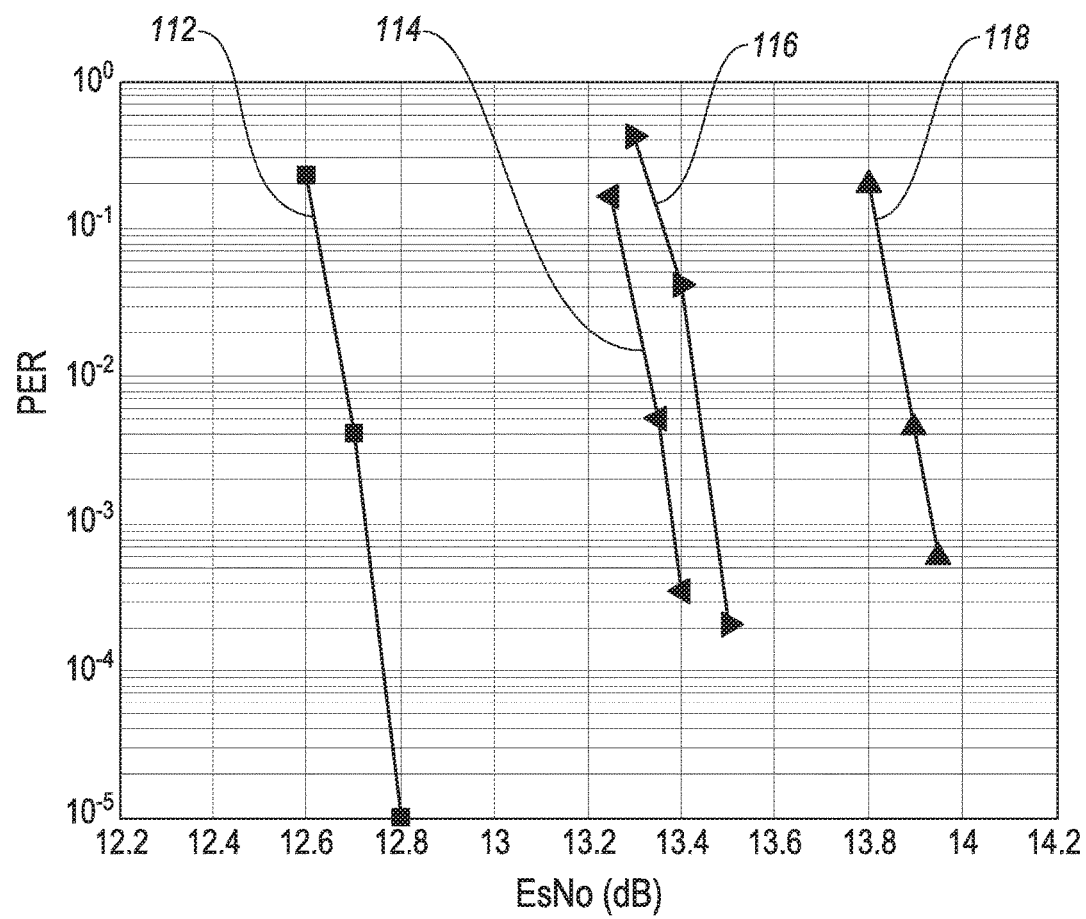
FIG. 11 is graph of an exemplary simulation of the packet error rate (PER) performance as a function of energy per symbol to noise spectral density ($E_s/N_0$) for carriers, with different degrees of erasure.

FIG. 11 shows the simulated packet error rate (PER) performance for an exemplary OFDM-like based system 51 as a function of $E_s/N_0$ for an inner carrier, as part of a four carriers-per-TWTA configuration.

Plot 112 represents a simulated result of a 128 point OFDM-like transmission with no erasure.

Plot 114 represents a simulated result of the 128 point OFDM-like transmission with erasure of 7 subcarriers.

Plot 116 represents a simulated result of the 128 point OFDM-like transmission with erasure of 8 subcarriers.

Plot 118 represents a simulated result of the 128 point OFDM-like transmission with erasure of 12 subcarriers.

The results, also tabulated in Table 1, indicate a loss of 0.65 dB when 7 out of the 128 subcarriers are erased, which corresponds to an interferer spanning 13.7 MHz. An increase in the required signal-to-noise ratio (SNR) can also be interpreted as a 6% reduction in throughput since the reduction in available SNR can result in transitioning to a lower spectral efficiency MODCOD. The throughput reduction is calculated using the MODCOD performance tables reported in the DVB-S2X standard. Similarly, results indicate an increase of 0.75 dB in the required SNR or a 9% reduction in throughput, when 8 subcarriers are erased and 1.14 dB increase in required SNR or an 11% reduction in throughput when 12 subcarriers are impacted by narrowband interference. The impact of similar erasures in conventional single-carrier systems is expected to be severe for receivers 17 with comparable complexity.

TABLE 1

Additional power needed for the LDPC decoder to decode the erased subcarriers

| Interference BW (MHz) | No. of Subcarriers Erased | Actual Extra Power Needed (dB) | Theoretical Extra Power Needed (dB) | Throughput Without Extra Power |
|---|---|---|---|---|
| 13.7 | 7 | 0.65 | 0.6 | ~93.9% |
| 15.6 | 8 | 0.75 | 0.7 | ~92.2% |
| 23.4 | 12 | 1.14 | 1.08 | ~89% |

Alternatively, if information on the interference is fed back to the transmitter 13, the corresponding subcarriers can be skipped, and more power can be allocated to the remaining subcarriers.

Table 2 provides a comparison of throughput when feeding back information about the interference-corrupted subcarriers. In the table, actual throughput equals the throughput with a higher code rate scaled with the number of subcarrier actually used, namely, (1+throughput improvement)×(128−n)/128, with n being the number of unused subcarriers. Also, the improvement over no feedback is the difference in throughput compared to the throughput values included in Table 1. As can be seen, only a marginal increase of $E_s/N_0$ is achieved, which may allow the use of a slightly higher code rate to increase throughput. Depending on the granularity of the DVB-S2X MODCODs available, the power improvement may not be sufficient to improve the MODCOD at all. But, due to use of a fewer number of subcarriers, there is still a small loss of throughput. Hence, compared with simply erasing the interfered OFDM subcarriers, as proposed in this invention, a small improvement in throughput may be possible, but at the expense of significant increase in complexity that would be associated with requiring a feedback path between receiver and transmitter.

TABLE 2

Throughput comparison when using information about interference-corrupted subcarriers is fed back to the transmitter

| Interference BW (MHz) | No. of Subcarriers Not Used | Power Improvement Per Used Subcarrier (dB) | Throughput Improvement Due to Higher Code Rate | Actual Throughput Considering Number of Subcarriers | Improvement Over No Feedback |
|---|---|---|---|---|---|
| 13.7 | 7 | 0.24 | 2.33% | 96.7% | 2.8% |
| 15.6 | 8 | 0.28 | 2.72% | 96.3% | 4.1% |
| 23.4 | 12 | 0.43 | 4.17% | 94.4% | 5.4% |

Note that, even though the simulation results are presented in terms of a traveling wave tube amplifier (TWTA), the system 10 works well with any nonlinear device, including for example satellite transponders that are based on solid-state power amplifier (SSPA) technology.

Orthogonal Frequency Scrambled Code Multiple Access (OF-SCMA)

Orthogonal Frequency Division Multiplexing (OFDM) like signalling may also be applied to the transmission of scrambled code multiple access (SCMA) signals. The generation and format of SCMA signals is described below. The use of OFDM-like signalling together with SCMA signals (OF-SCMA) increases resistance to partial band jamming.

Figure 12:
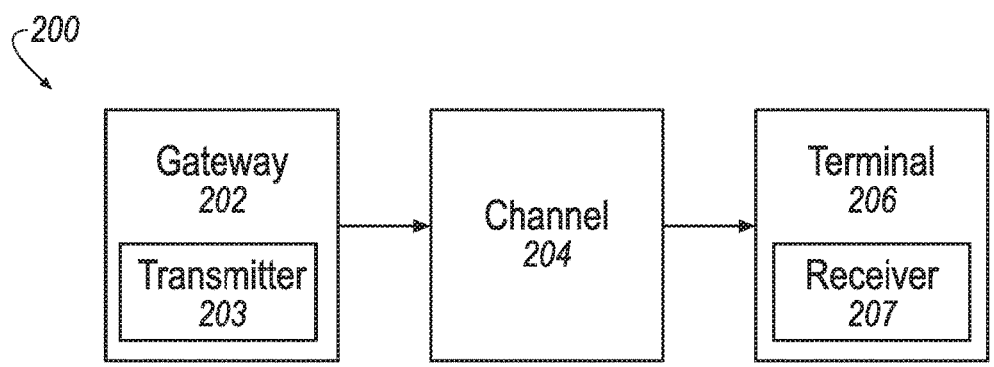
FIG. 12 is a block diagram of an exemplary system for Scrambled Code Multiple Access (SCMA) based satellite transmissions including frequency division multiplexing and narrowband interference erasure.

FIG. 12 is a diagram of an exemplary system 200 for SCMA communications, including OFDM-like signal transmission to improve anti-jamming resistance.

The system 200 includes a Gateway 202, a transmission channel 204 and a terminal 206.

The gateway 202 is similar to the gateway 12 described above, and includes a transmitter 203 for transmitting, via a channel 204, SCMA based signals including OFDM-like signaling, to a terminal 206.

The transmitter 203 is similar to the transmitter 13. As described below, the transmitter 203 is programmed to apply OFDM-like signaling to an SCMA based signal.

An exemplary process 240 for transmitting SCMA based signals, including OFDM-like transmission, is described below.

The channel 204 is the same as or similar to the channel 14 described above.

The terminal 206 is similar to the terminal 16 described above and is programmed to receive communications from the gateway 202 via a channel 204. The terminal 206 includes a receiver 207.

The receiver 207 is similar to the receiver 17 described above. The receiver 207 is programmed to receive SCMA based signals including OFDM-like signaling. The receiver 207 is further programmed, as described in detail below, to erase signal components associated with subcarriers subject to narrowband interference. The narrowband interference may include jamming.

Figure 13:
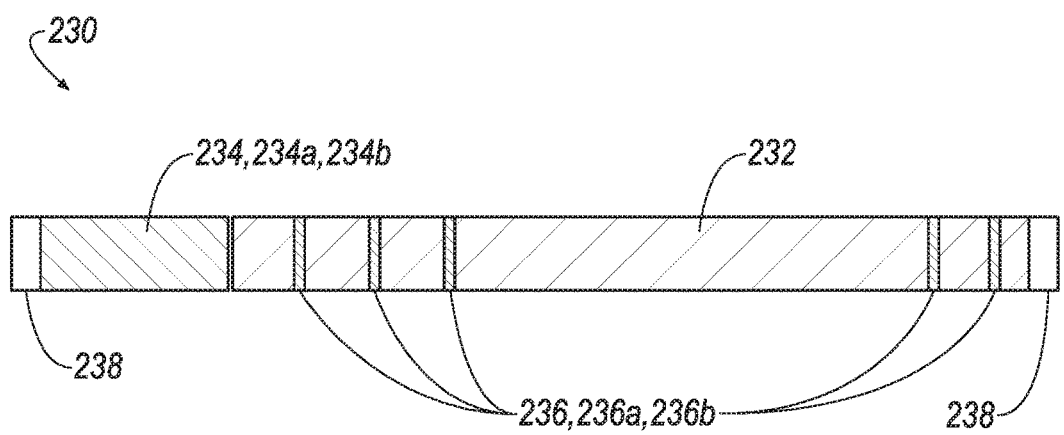
FIG. 13 is a diagram of an exemplary SCMA-based signal.

FIG. 13 shows an exemplary scrambled code multiple access (SCMA) waveform 230. The SCMA waveform 230 typically includes an SCMA codeblock 232, one or more unique words 234, one or more pilots 236, and may further include one or more guardbands 238. Pilots 236 may also be referred to as pilot symbols 236 herein.

The SCMA codeblock 232 includes the data to be transmitted. The data may be interleaved, as is known. The codeblock 232 may further include error correction encoding. The error correction encoding may be a low rate k/n low-density parity-check (LDPC) code with, for example, n=9 and k=1, 2, 3, 4, 5, and 6.

Additionally, the codeblock 232 is modulated. The modulation may be low level modulation such as binary phase-shift keying (BPSK) or quadrature phase-shift keying (QPSK) as is known.

The SCMA waveform 236 may include one or more unique words (UW) 234. The UWs 234 may be inserted, for example, prior to the codeblock 232. The UWs 234 allow independent acquisition of each individual codeblock 232 in the case, e.g., that the reception of the previous codeblock 232 was unsuccessful. Optionally, the UW 234 can include a guard time 238 at the beginning. The guard time 238 can be used, for example, to provide a buffer between signals multiplexed from different terminals. The UWs 234 may be configured for use for reacquisition in the time domain and/or for synchronization of the receiver 207 in the frequency domain.

The SCMA waveform 230 may further include one or pilots 236. Each pilot 236 may be, for example, a symbol. The transmitter 203 may insert a pilot 236 into the codeblock 232 once every m symbols. In order to minimize overhead, m may be selected to be greater than ten. The pilots 236 may be configured for synchronization of the receiver 207 in one or both of the time domain and the frequency domain.

The SCAMA waveform 230 may additionally be scrambled and/or frequency spread.

The SCMA waveform 230, as shown in FIG. 13, has several advantages over, for example, transmission based on code division multiple access (CDMA). SCMA requires less bandwidth than CDMA to achieve the same performance. Additionally, SCMA is designed for independent time division multiple access (TDMA)-like code-block-by-codeblock acquisition, facilitating rapid recovery from loss of signal in the sub-millisecond range.

SCMA includes several features that support robust transmission and resistance to jamming. With low rate codes, SCMA operates under the noise floor, and is not visible by spectral analysis. Variable code rates, modulation and spreading factors allow a transmission system such as the exemplary transmission system 200 to make trade-offs between throughput, bandwidth vs. power and anti-jamming capabilities, thus optimizing operation to current conditions. Synchronization is designed to support reliable operation in adverse noise/interference environments. Also, as will be described below, SCMA can be transmitted by OFDM-like signalling, to further enhance anti-jamming resistance.

Typically, partial band jammers concentrate jamming power in a narrow portion of the signal band to disrupt communications. By focusing the jamming power in a narrow portion of the signal band, the total required jamming power to disrupt communications can be relatively small and can be achieved, in some cases with a relatively small transmitter. Partial band jammers may also change its frequency with period sweeps (chirps) or random hops to defeat simple counter measures. Orthogonal frequency division multiplex-like signalling based on SCMA can mitigate partial band jamming while preserving the advantageous features of SCMA. Transmission and reception processes for SCMA formatted signals including orthogonal frequency division multiplexing are described below.

Figure 14:
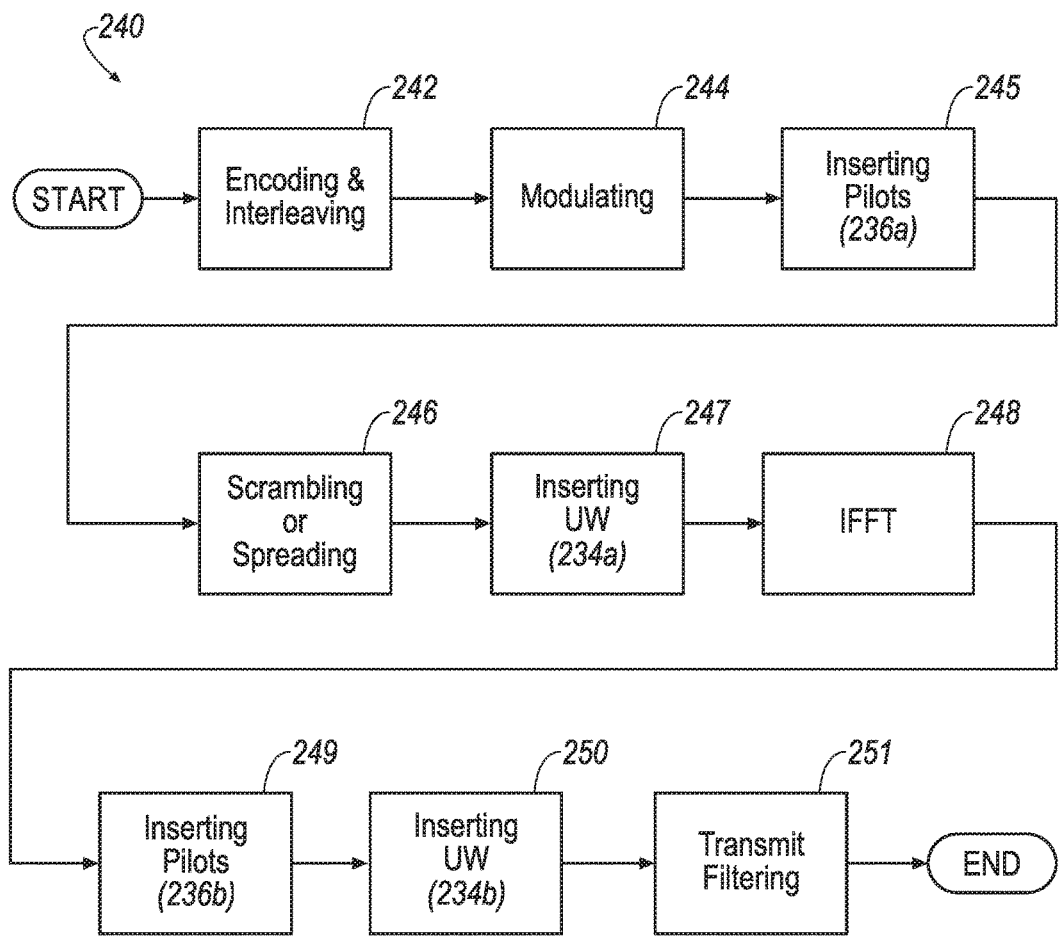
FIG. 14 is a diagram of an exemplary process for transmitting an SCMA-based signal via satellite including frequency division multiplexing.

FIG. 14 is a diagram of an exemplary process 240 for transmitting SCMA formatted signals via satellite including orthogonal frequency division multiplexing. The process 240 starts in a block 242.

In the block 242, the transmitter 203 is programmed to receive an SCMA codeblock 232 for transmission via the channel 204 to the terminal 206 receiver 207. For example, the SCMA codeblock 232 may include 7200 coded bits. The transmitter 203 generates an encoded vector signal from the first source signal. The encoded vector signal includes error correction encoding. For SCMA-based communications, the transmitter 203 may employ, for example, a low rate k/n low-density parity-check (LDPC) code with, for example, n=9 and k=1, 2, 3, 4, 5, and 6. Additionally or alternatively, the transmitter 203 may interleave data from the first source signal in the encoded vector signal.

Upon generating the encoded vector signal, the process 240 continues in a block 244.

In the block 244, the transmitter 203 is programmed to modulate the encoded vector signal. Initially, as described in reference to the block 32 of process 130, the transmitter 203 generates a vector of symbols based on the encoded signal. Each component of this vector is drawn from a complex-valued digital constellation. Two examples of constellations applicable to SCMA-based communications are binary phase-shift keying (BPSK) and quadrature phase-shift keying (QPSK). An exemplary 7200 bit SCMA codeblock 232 yields 7200 symbols when modulated with BPSK or 3600 symbols when modulated with QPSK.

The transmitter 203 segments the vector of coded symbols into blocks; each block including symbols to modulate orthogonal subcarriers in the frequency domain. Again as described with regard to the block 32 of the process 130, it may be necessary to pad a small number of extra symbols in order to make the number symbols for each orthogonal subcarrier a whole integer. Alternatively, shortening or puncturing can be used. Upon generating the vector of symbols, the process continues in a block 245.

In the block 245, one or more first pilot symbols 236a may be inserted into the coded symbols in the frequency domain. For example, for BPSK modulation, a first pilot symbol 236a may be inserted after every 11 BPSK symbols, resulting in a total of 7854 symbols, based on the exemplary 7200 bit SCMA codeblock 232. For QPSK modulation, a first pilot symbol 236a may be inserted after 25 QPSK symbols, resulting in a total of 3744 symbols based on the exemplary 7200 bit SCMA codeblock 232.

Upon completing block 245, the process 240 continues in a block 246.

In the block 246, the transmitter 203 is programmed to scramble and/or frequency spread, as is known, the vector of symbols. Upon scrambling and/or frequency spreading the vector of symbols, the process 240 continues in a block 247.

In the block 247, a first Unique Word (UW) 234a may be optionally inserted in the vector of symbols. The first UW 234a may be used, for example, to perform synchronization for some parameters in the frequency domain, such as channel estimation. Upon completing block 247, the process 240 continues in a block 248.

In the block 248, the transmitter 203 is programmed to perform an inverse fast Fourier transform (IFFT) on the scrambled and/or frequency spread vector of symbols. The IFFT is performed as described with regard to the block 34 of process 130.

As an example, for a typical 36 MHz transponder, and a partial band jammer having a bandwidth on the order of several MHz, a 32-point IFFT may provide sufficient granularity.

The output of the IFFT is an SCMA-based, time domain codeblock 232 together with one or more first pilots 236a and optionally one or more first UWs 234a. Upon generating the SCMA-based, time domain codeblock 232 with first pilots 236a and optional first UWs 234a, the process 240 continues in a block 249.

In the block 249, the transmitter 203 is programmed, optionally, to insert one or more second pilot symbols 236b in the time domain. The one or more second pilots 236b may be used to synchronize reception of the SCMA waveform 230 in the time domain. Upon completing the block 249, the process 240 continues in a block 250.

In the block 250, the transmitter 203 is programmed, optionally, to insert a second Unique Word (UW) 234b into the SCMA-based waveform 230. As an example, a 512-symbol frame sync second UW 234b made be used for BPSK, or a 256-symbol frame sync second UW 234b for QPSK. The second UW 234b may be used to synchronize the FFT operation in the receiver 207 with the IFFT operation in the transmitter 203. As an example, the second UW 234b may be designed to achieve to achieve acquisition or course estimation of some synchronization parameters at −8.5 dB $E_s/N_0$ for BPSK, and −5.5 dB $E_s/N_0$ for QPSK. Following the block 250, the process 240 continues in a block 251.

In the block 251, the transmitter 203 is programmed to apply a filter such as an interpolation filter to the SCMA-based waveform 230. As described with regard to the block 36 of process 130, this can be done using a polyphase filter structure. The filter coefficients can follow a root-raised cosine (RRC) shape with low rolloff values.

The following table summarizes two example implementations of OF-SCMA, a first one with BPSK modulation, and a second one with QPSK modulation.

TABLE 3

Example Implementations of OF-SCMA

| | Coded Symbols | Pilot 236a Symbols | Pilot 236b Symbols | Padding Symbols | Total Symbols | OFDM Symbols | UW 234a Symbols | UW 234b Symbols | $E_s/N_0$ (dB) |
|---|---|---|---|---|---|---|---|---|---|
| BPSK | 7200 | 654 | 0 | 18 | 7872 | 246 | 0 | 512 | −8.5 |
| QPSK | 3600 | 144 | 0 | 0 | 3744 | 117 | 0 | 256 | −5.5 |

Upon application of the interpolation filter to the time SCMA-based, time domain codeblock, the transmitter 203 transmits the filter output signal, via the channel 204, to the terminal 206 receiver 207.

Figure 15:
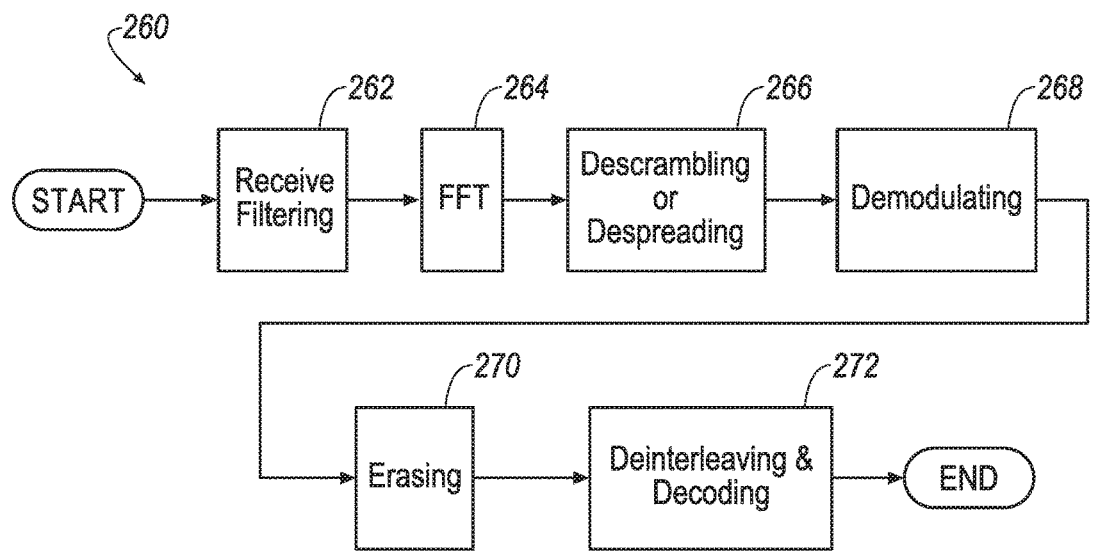
FIG. 15 is a diagram of an exemplary process for receiving an SCMA-based signal via satellite including erasure of signal components associated with subcarriers subject to interference.

FIG. 15 is a diagram of an exemplary process 260 for receiving SCMA formatted signals via satellite including erasure of signal components associated with subcarriers subject to interference. The process 260 starts in a block 262.

In the block 262, the terminal 206 receiver 207 is programmed to receive a first received signal from the gateway 202 transmitter 203 via the channel 204. The receiver is further programmed to perform decimation filtering on the received first received signal. As described with regard to the block 42 of the process 170, the receiver 207 may be programmed to apply a polyphaser filter structure. The filter coefficients may be selected to form a matched pair with the coefficients used at the gateway 202 transmitter 203, and can follow a root-raised cosine (RRC) shape with low rolloff values. Upon applying the decimation filter function to the first received signal, the process 260 continues in a block 264.

In the block 264, the receiver 207 is programmed to perform a fast Fourier transform (FFT) operation on the output signal from the decimation filtering. The receiver 207 may perform the FFT as described with regard to the block 44 of process 170. The receiver 207 generates, by the FFT operation, a codeblock of received symbols in the frequency domain. Upon generating the codeblock of received symbols, the process 260 continues in a block 266.

In the block 266, the receiver 207 is programmed to perform descrambling and/or despreading, as is known, on the codeblock of received symbols. Upon performing the descrambling and/or despreading operation, the process 260 continues in a block 268.

In the block 268, the receiver 207 is programmed to demodulate the descrambled and/or despread version of the codeblock of received signals. The demodulation may include BPSK or QPSK demodulation. Based on the codeblock of received signals, the receiver 207 generates log-likelihood ratio (LLR) values of the received bits, as described with regard to the block 46 of the process 170. Upon generating the LLR values, the process 260 continues in a block 270.

In the block 270, the receiver 207 is programmed to erase bits corresponding to subcarriers that are corrupted by interference. The interference may include intentional jamming. In order to erase the interference-corrupted subcarriers, the receiver 207 may be programmed to replace the LLR values associated with the interference-corrupted bits with zeroes in decibels.

As described in regard to the block 48 of process 170, the interfered frequency may be known. In other cases, the interfered frequency may be determined by identifying power level peaks across the frequency range of interest.

Upon erasing the bits corresponding to interference-corrupted subcarriers, the process 260 continues in a block 272.

In the block 272, the receiver 207 is programmed to deinterleave the received bits and to decode the deinterleaved bits to retrieve estimates of the transmitted information bits.

Upon retrieving estimates of the transmitted information bits, the process 260 ends.

As with the transmit and receive processes 130, 170 described above, the transmit and receive process 240, 260 can interwork with Adaptive Coding and Modulation (ACM), as a lower modulation and code (MODCOD) rate pair can be used for the interfered sites to provide best performance under current conditions. The expected partial-band jamming resistance depends on the code rate in use and the code rate that could be used without jammer as summarized in the table below.

TABLE 4

Code Rate Adaptation for Partial-band Jamming Resistance

| Code Rate in use Vs. Code Rate that could be used w/o jammer | 1/9 | 2/9 | 3/9 | 4/9 | 5/9 |
|---|---|---|---|---|---|
| 2/9 | 43% | | | | |
| 3/9 | 60% | 28% | | | |
| 4/9 | 70% | 46% | 23% | | |
| 5/9 | | 55% | 36% | 18% | |
| 6/9 | | | 47% | 30% | 15% |

Throughput reduction generally aligns with the loss of bandwidth due to jamming. For example, with adequate power to transmit receiver at about 1 dB $E_s/N_0$ that would support rate 4/9 without jamming (slightly above noise floor of the receiver), up to 70% of the band can suffer jamming and still sustain reliable communications at reduced throughput (rate 1/9).

In the case that the loss of bandwidth due to jamming is known, the transmitter 203 can adapt the code rate to achieve optimal transmission under the known conditions. Note that the throughput reduction is independent or nearly independent of the strength (spectral power density) of the jammer.

Figure 16:
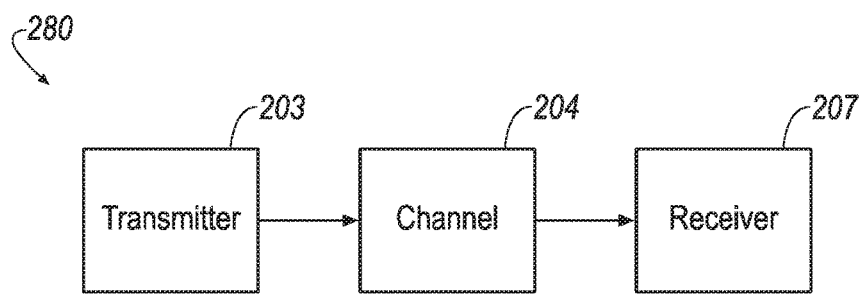
FIG. 16 is a block diagram of an exemplary system for simulating SCMA-based satellite communication including frequency division multiplexing and narrowband interference erasure.

FIG. 16 illustrates a simulation model 280 for simulating an OFDM-like transmission signal for SCMA-based data according to the presently disclosed teachings including the exemplary transmitter 203, the exemplary channel 204 and the exemplary receiver 207 from system 200. The operation of the exemplary transmitter 203 and the exemplary receiver 207 are described in detail above.

A simulation was performed based on the simulation model 280, based on the following parameters.
Modulation: QPSK
Rolloff: 0.1
OBO: 2.9 dB
N=32

Figure 17:
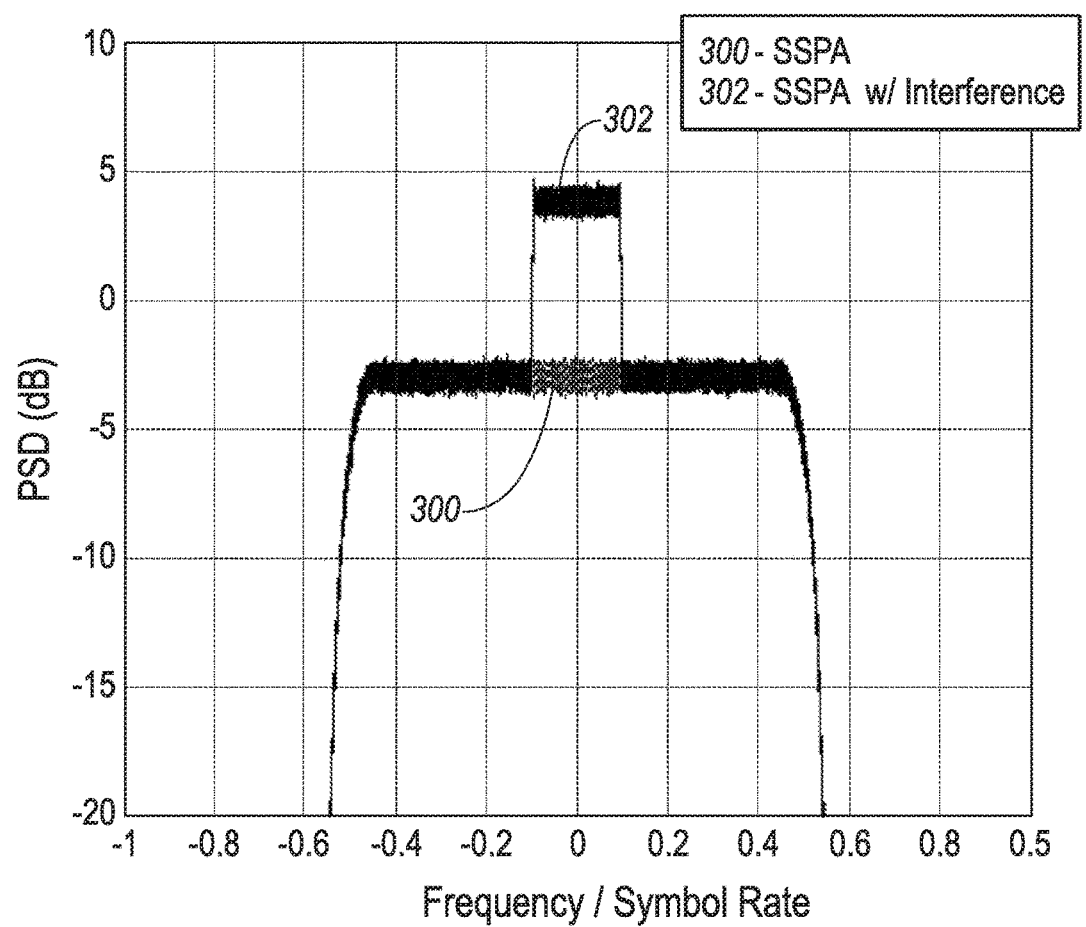
FIG. 17 is a graph of an exemplary simulation of a satellite transmission channel transmitting SCMA-based signals including frequency division multiplexing and illustrating narrowband interference.

FIG. 17 is a graph of an exemplary simulation of a satellite transmission channel transmitting signals based on SCMA including orthogonal frequency division multiplexing and illustrating narrowband interference. The graph shows plots of a simulated exemplary signal spectrum as received at the receiver 207 input with and without interference according to the simulation model 280 and based on the above specified parameters. A jamming signal of about 20% is attempting to disrupt the signal. The plots are shown without noise for clarity of the illustration.

Figure 18A:
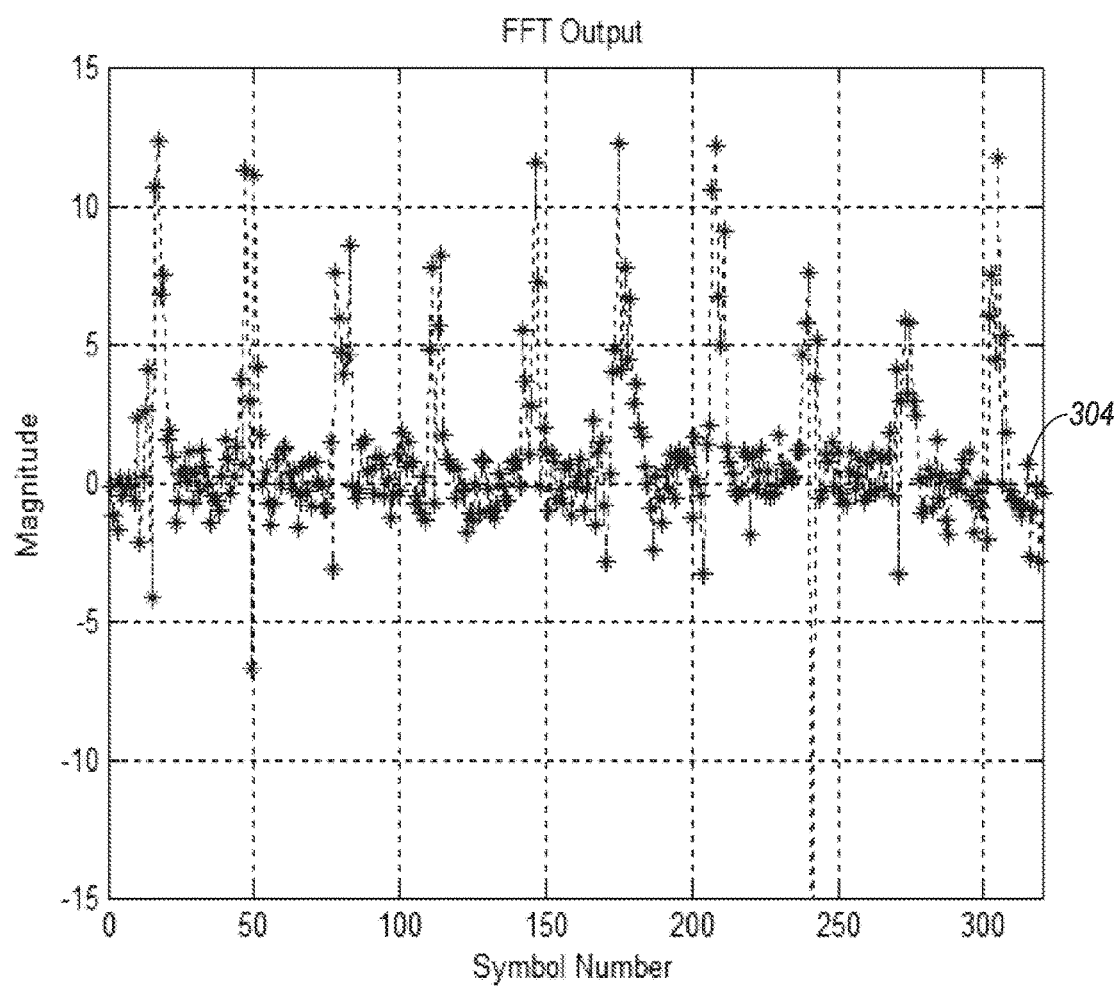
FIG. 18A is a graph of an exemplary simulation of an SCMA-based signal showing the FFT output of received samples occurring at frequency bins corresponding to the subcarriers impacted by a narrowband interferer.

FIG. 18A is a graph of an exemplary simulation of an SCMA based signal showing the fast Fourier transform output of received samples occurring at frequency bins corresponding to the frequencies being interfered in each OFDM symbol spanning 32 FFT frequency bins.

Figure 18B:
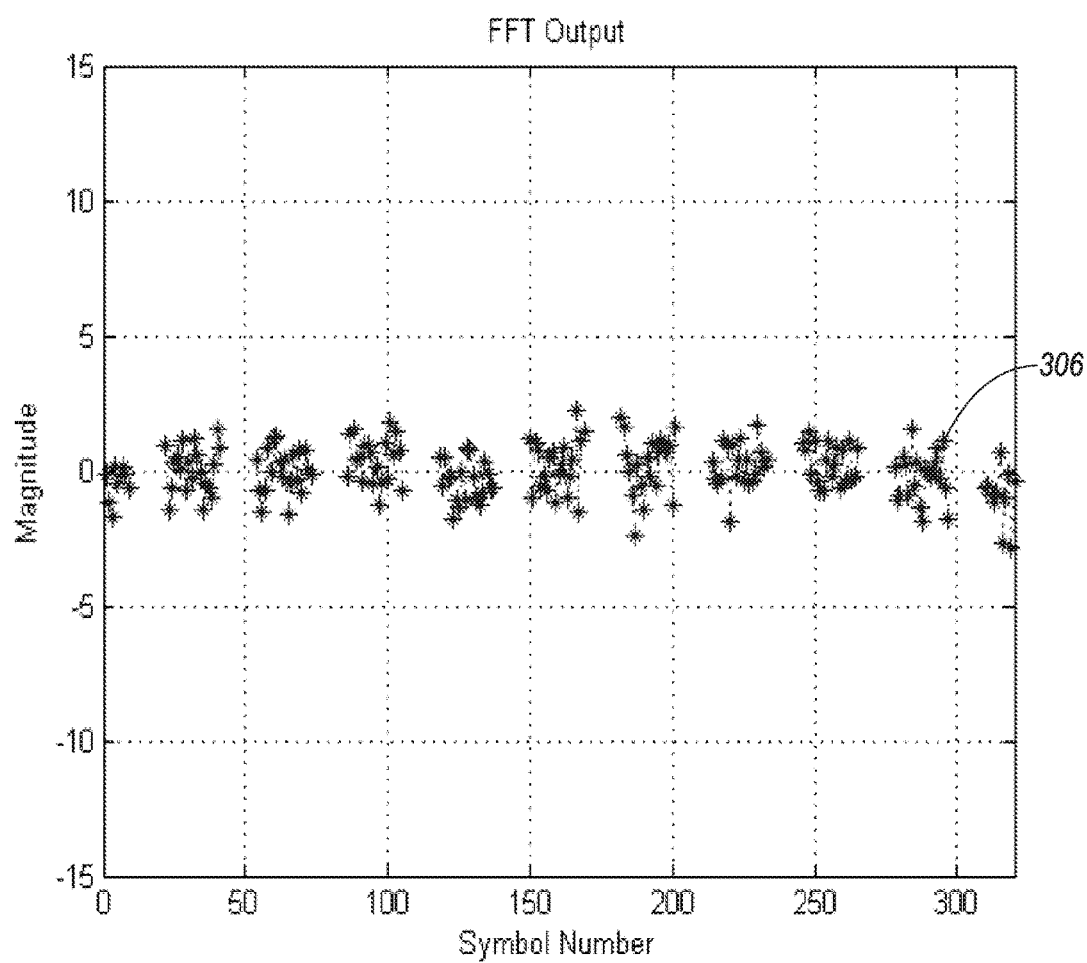
FIG. 18B is a graph of the exemplary simulation of FIG. 18A with erasure of the signal components associated with subcarriers impacted by the narrowband interferer.
Figure 19:
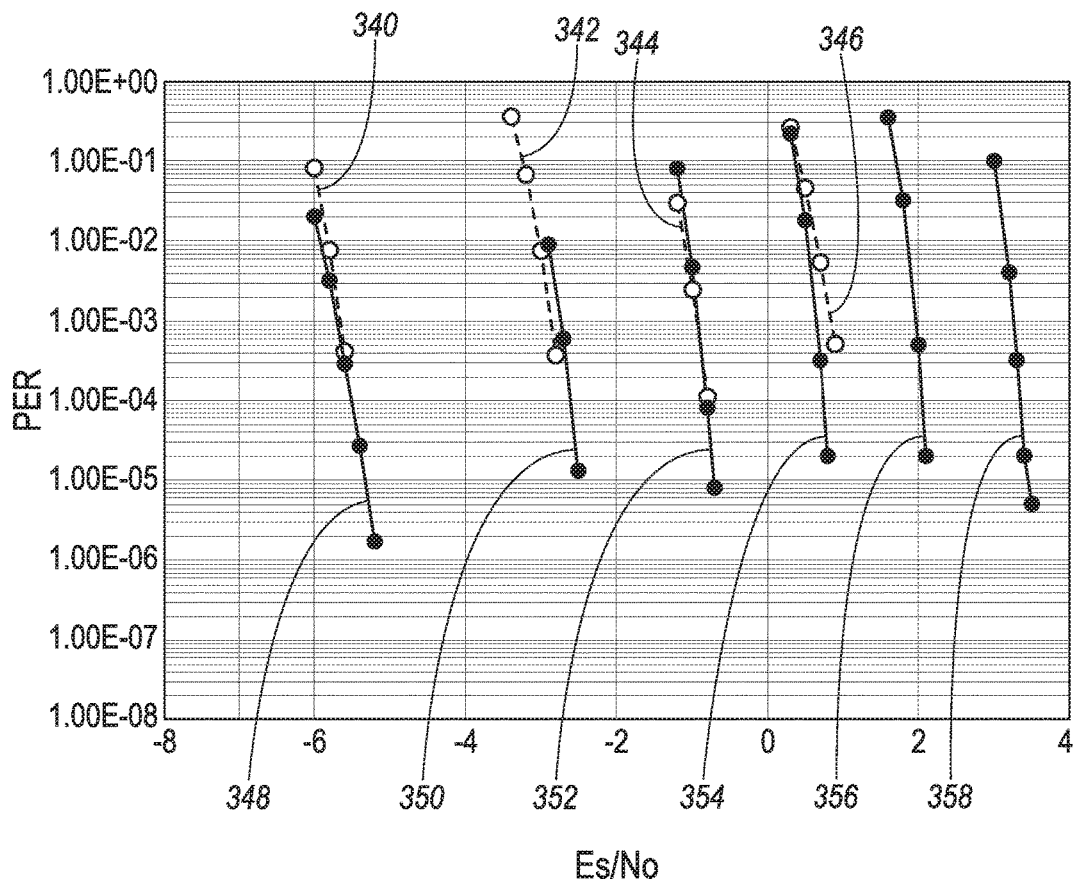
FIG. 19 is a graph of an exemplary simulation of the packet error rate (PER) performance as a function of energy per symbol to noise spectral density ($E_s/N_0$) for SCMA based transmission including frequency division multiplexing, with different degrees of erasure.
Figure 20:
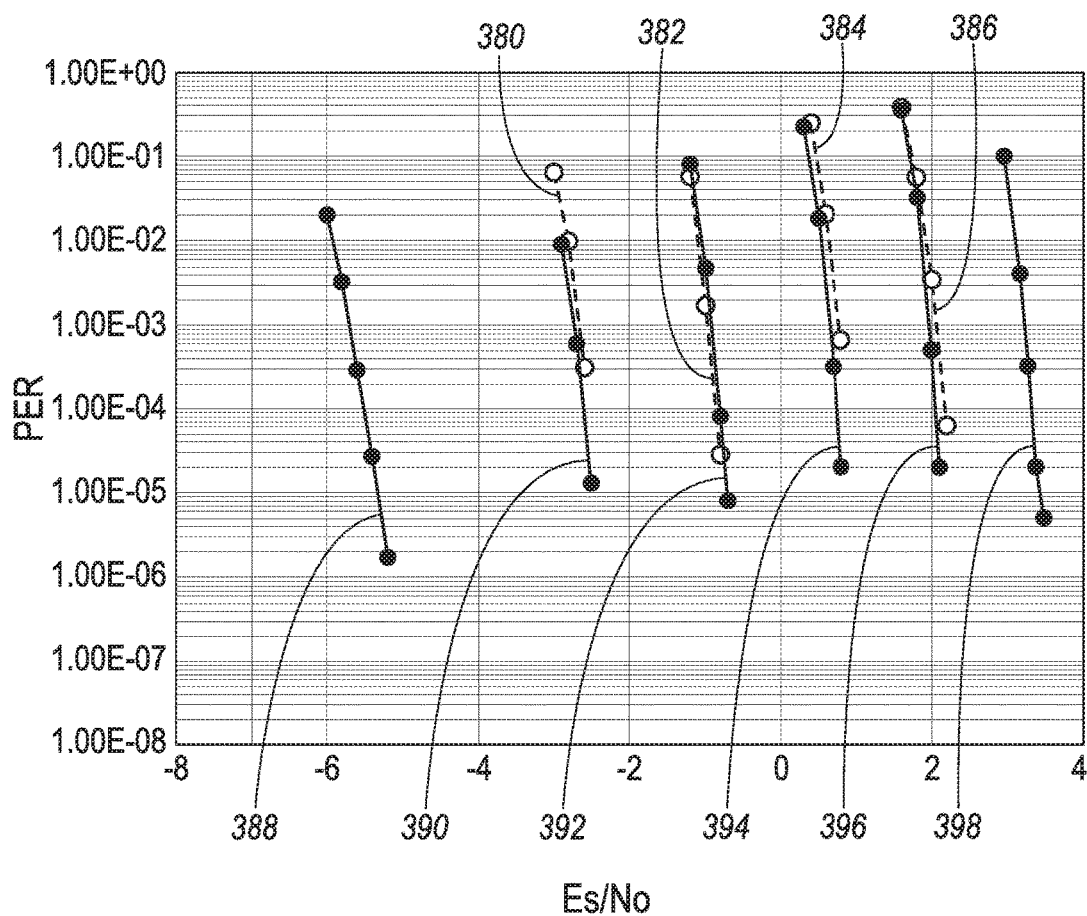
FIG. 20 is a graph of an exemplary simulation of the packet error rate (PER) performance as a function of energy per symbol to noise spectral density ($E_s/N_0$) for SCMA based transmission including frequency division multiplexing, with different degrees of erasure.
Figure 21:
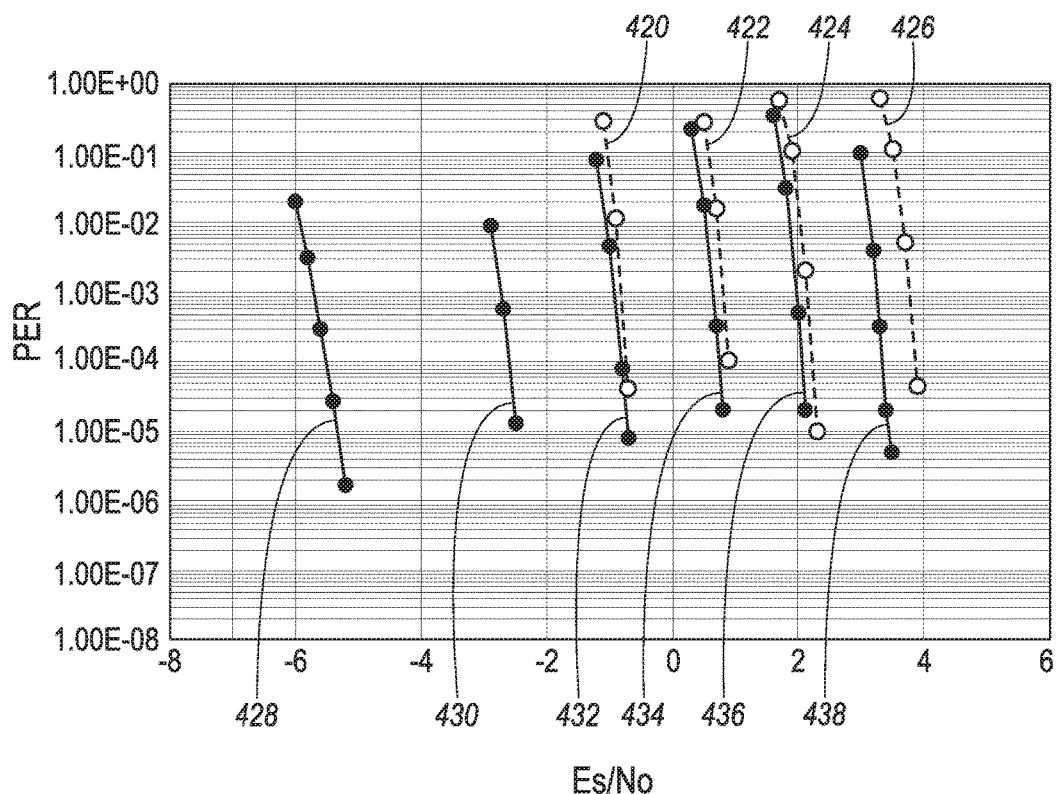
FIG. 21 is a graph of an exemplary simulation of the packet error rate (PER) performance as a function of energy per symbol to noise spectral density ($E_s/N_0$) for SCMA based transmission including frequency division multiplexing, with different degrees of erasure.
Figure 22:
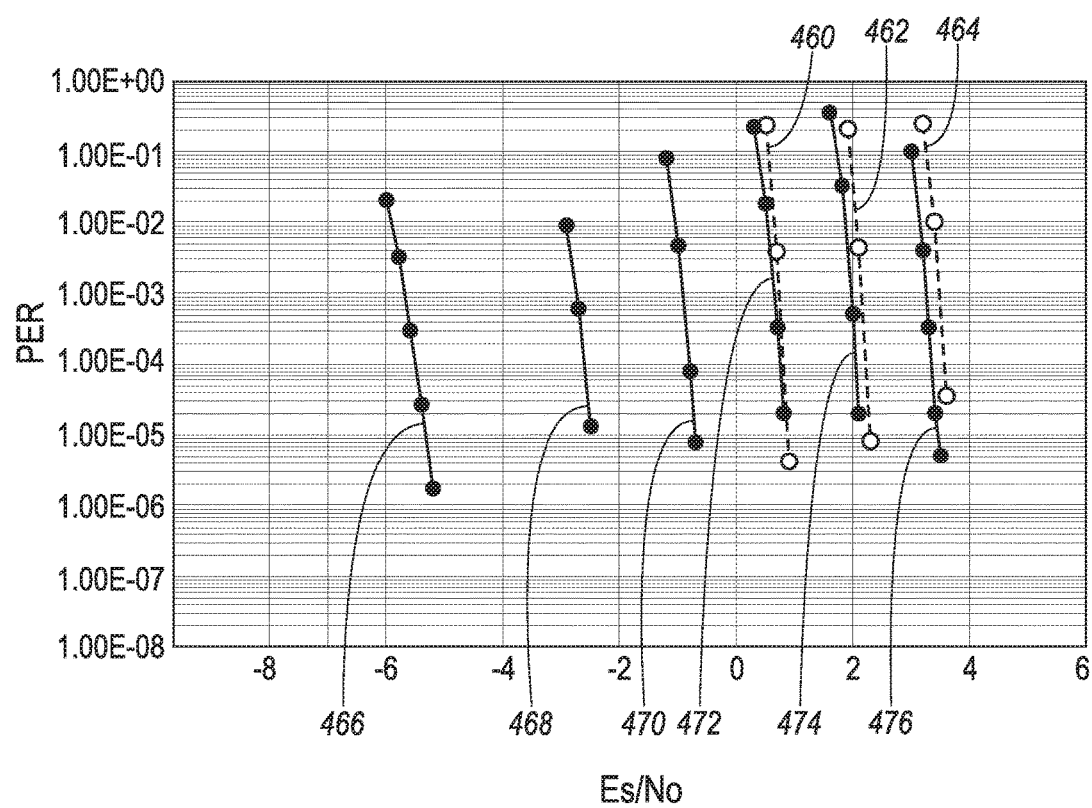
FIG. 22 is a graph of an exemplary simulation of the packet error rate (PER) performance as a function of energy per symbol to noise spectral density ($E_s/N_0$) for SCMA based transmission including frequency division multiplexing, with different degrees of erasure.

FIG. 18B is a graph of the exemplary simulation of FIG. 18A with erasure of the received samples corresponding to the interference (jamming signal) frequency.

FIGS. 19-22 are graphs respectively of simulations for SCMA QPSK rate 1/9 with erasure, SCMA QPSK rate 2/9 with erasure, SCMA QPSK rate, SCMA QPSK rate 3/9 with erasure and SCMA QPSK rate 4/9 with erasure. Each of the graph shows the results of an exemplary simulation of the packet error rate (PER) performance as a function of energy per symbol to noise spectral density ($E_s/N_0$) for SCMA based transmission including frequency division multiplexing, with different degrees of erasure.

CONCLUSION

As used herein, the adverb "substantially" means that a shape, structure, measurement, quantity, time, etc. may deviate from an exact described geometry, distance, measurement, quantity, time, etc., because of imperfections in materials, machining, manufacturing, etc.

The term "exemplary" is used herein in the sense of signifying an example, e.g., a reference to an "exemplary widget" should be read as simply referring to an example of a widget.

Networked devices such as those discussed herein generally each include instructions executable by one or more networked devices such as those identified above, and for carrying out blocks or steps of processes described above. For example, process blocks discussed above may be embodied as computer-executable instructions.

Computer-executable instructions may be compiled or interpreted from computer programs created using a variety of programming languages and/or technologies, including, without limitation, and either alone or in combination, Java™, C, C++, Python, Visual Basic, Java Script, Perl, HTML, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media. A file in a networked device is generally a collection of data stored on a computer readable medium, such as a storage medium, a random access memory, etc.

A computer-readable medium includes any medium that participates in providing data (e.g., instructions), which may be read by a computer. Such a medium may take many forms, including, but not limited to, non-volatile media, volatile media, etc. Non-volatile media include, for example, optical or magnetic disks and other persistent memory. Volatile media include dynamic random access memory (DRAM), which typically constitutes a main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with rules of holes, a RAM, a PROM, an EPROM, a FLASH-EEPROM, any other memory chip or cartridge, or any other medium from which a computer can read.

In the drawings, the same reference numbers indicate the same elements. Further, some or all of these elements could be changed. With regard to the media, processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

The invention claimed is:

1. A receiver comprising a processor and a non-transitory memory, the non-transitory memory storing instructions executable by the processor such that the processor is programmed to:
   receive a first signal including a plurality of first signal components associated respectively with a plurality of subcarriers over a communications channel;
   apply a filter to the first signal;
   determine, based on the first signal after filtering, from the plurality of subcarriers, a subcarrier subject to interference;
   erase the first signal component associated with the subcarrier determined to be subject to interference; and
   reconstruct the first signal based on the plurality of first signal components excluding the erased first signal component.

2. The receiver of claim 1, wherein the first signal is forward error correction encoded, and further wherein reconstructing the first signal includes forward error correction decoding.

3. The receiver of claim 2, wherein the forward error correction encoding includes a k/n low-density parity-check code with n=9 and k=1, 2, 3, 4, 5, or 6.

4. The receiver of claim 2, wherein the processor is further programmed to:
   determine a log-likelihood ratio for one or more of the first signal components, wherein erasing of the first signal component associated with the subcarrier subject to interference includes setting the log-likelihood ratio to zero for the first signal component associated with the subcarrier subject to interference.

5. The receiver of claim 4, wherein the log-likelihood ratio for the one or more first signal components is generated based at least in part on amplitude phase-shift keying demodulation.

6. The receiver of claim 1, wherein filtering the first signal is based at least in part on decimating filter coefficients.

7. The receiver of claim 1, wherein the processor is further programmed to:
   receive data indicating a frequency of a source of interference; and
   determine the subcarrier subject to interference based on the data.

8. The receiver of claim 1, wherein determining that the subcarrier is subject to interference is based at least in part on a power level of the subcarrier being greater than a threshold.

9. The receiver of claim 1, wherein the processor is further programmed to:
   measure a power level of one or more of the plurality of subcarriers; and
   determining the subcarrier is subject to interference is based at least in part on the power level of the subcarrier relative to the power level of one or more other subcarriers.

10. The receiver of claim 1, wherein the plurality of subcarriers are orthogonal.

11. The receiver of claim 1, wherein the plurality of subcarriers includes a number N of subcarriers, and the processor is further programmed to:
    perform, prior to determining the subcarrier subject to interference, an N point fast Fourier transform on the received first signal.

12. The receiver of claim 11, wherein the first signal includes a unique word and the processor is further programmed to:
    synchronize the fast Fourier transform based on the unique word.

13. The receiver of claim 1, wherein the communications channel includes a satellite.

14. The receiver of claim 1, wherein the first signal includes one or more pilot symbols and the processor is further programmed to:
    synchronize reception of the first signal based on the one or more pilot symbols.

15. The receiver of claim 1, wherein the first signal includes scrambling, and the processor is further programmed to:
    descramble the first signal prior to determining from the plurality of subcarriers a subcarrier subject to interference.

16. The receiver of claim 1, wherein the first signal includes frequency spreading, and the processor is further programmed to:
    despread the first signal prior to determining from the plurality of subcarriers a subcarrier subject to interference.

17. The receiver of claim 1, wherein a power level of the first signal is below a power level of a noise floor.

18. A transmitter comprising a first computing device comprising a first processor and a first non-transitory memory, the first non-transitory memory storing instructions executable by the first processor such that the first processor is programmed to:
    receive a first source signal;
    generate, based on the first source signal, a plurality of first source signal components;
    associate the plurality of first source signal components respectively with a plurality of subcarriers;
    generate a second source signal including one or more of the first signal components together with the respective subcarriers associated with the one or more first signal components;
    generate a third source signal by applying a transmit filter operation to the second source signal; and
    transmit the third source signal to a second computing device.

19. The transmitter of claim 18 wherein the subcarriers are orthogonal.

20. The transmitter of claim 18, wherein generating the second source signal includes inserting one or more pilot symbols into the second source signal.

21. The transmitter of claim 18, wherein generating the plurality of first source signal components includes encoding the first source signal components for forward error correction.

22. The transmitter of claim 21, wherein the forward error correction includes a k/n low-density parity-check code with n=9 and k=1, 2, 3, 4, 5, or 6.

23. The transmitter of claim 18 wherein the third source signal is transmitted via a communications channel including a satellite.

24. The transmitter of claim 18 wherein applying the transmit filter operation includes applying an interpolation filter operation.

25. The transmitter of claim 18 wherein associating the plurality of first source signal components respectively with the plurality of subcarriers is performed with an inverse fast Fourier transform.

26. The transmitter of claim 18, wherein, prior to associating the plurality of first source signal components respectively with the plurality of subcarriers, the first processor is further programmed to:
scramble respectively the plurality of first source signal components.

27. The transmitter of claim 18, wherein, prior to associating the plurality of first source signal components respectively with the plurality of subcarriers, the first processor is further programmed to:
spread the frequency respectively of the plurality of first source signal components.

28. The transmitter of claim 18, wherein the first processor is further programmed to:
insert a unique word into the second source signal.

29. A system comprising the transmitter of claim 21, further comprising a second computing device comprising a second processor and a second non-transitory memory, the second non-transitory memory storing instructions executable by the second processor such that the second processor is programmed to:
receive the third source signal including the one or more first signal components associated respectively with the one or more subcarriers;
determine, from the one or more subcarriers, a subcarrier subject to interference;
erase the first signal component associated with the subcarrier determined to be subject to interference; and
reconstruct the first signal based on the one or more of first signal components excluding the erased first signal component.

30. The system of claim 29, wherein reconstructing the third source signal includes forward error correction decoding.

31. The system of claim 29, wherein the second processor is further programmed to:
filter, prior to determining the subcarrier subject to interference, the third source signal.

32. A method comprising:
receiving, by a processor in a computing device, a first signal including a plurality of first signal components associated respectively with a plurality of subcarriers over a communications channel;
applying a filter to the first signal;
determining, based on the first signal after filtering, from the plurality of subcarriers, a subcarrier subject to interference;
erasing the first signal component associated with the subcarrier determined to be subject to interference; and
reconstructing the first signal based on the plurality of first signal components excluding the erased first signal component.

33. The method of claim 32, wherein the first signal is forward error correction encoded, and further wherein reconstructing the first signal includes forward error correction decoding.

34. The method of claim 33, further comprising:
determining a log-likelihood ratio for the one or more first signal components, wherein erasing of the first signal component associated with the subcarrier subject to interference includes setting the log-likelihood ratio to zero for the first signal component associated with the subcarrier subject to interference.

35. The method of claim 32, further comprising:
receiving data indicating a frequency of a source of interference; and
determining the subcarrier subject to interference based at least in part on the data.

36. The method of claim 32, further comprising:
determining that the subcarrier is subject to interference based at least in part on a power level of the subcarrier.

37. The method of claim 32, wherein the one or more subcarriers includes a number N of subcarriers, further comprising:
performing, prior to determining the subcarrier subject to interference, an N point fast Fourier transform on the received first signal.

38. The method of claim 37, wherein the first signal includes a unique word, further comprising:
synchronizing the fast Fourier transform based at least in part on the unique word.

39. The method of claim 32, wherein the first signal includes a pilot symbol, further comprising:
synchronizing reception of the first signal based at least in part on the pilot symbol.

40. The method of claim 32, wherein the first signal includes scrambling, further comprising:
descrambling the first signal prior to determining, from the plurality of subcarriers, the subcarrier subject to interference.

41. The method of claim 32, wherein the first signal includes frequency spreading, further comprising:
despreading the first signal prior to determining, from the plurality of subcarriers, the subcarrier subject to interference.

* * * * *